(12) United States Patent
Scholz

(10) Patent No.: US 11,101,063 B2
(45) Date of Patent: Aug. 24, 2021

(54) PLANAR TRANSFORMER FOR ENERGY TRANSFER

(71) Applicant: Phoenix Contact GmbH & Co. KG, Blomberg (DE)

(72) Inventor: Peter Scholz, Barntrup (DE)

(73) Assignee: Phoenix Contact GmbH & Co. KG, Blomberg (DE)

( * ) Notice: Subject to any disclaimer, the term of this patent is extended or adjusted under 35 U.S.C. 154(b) by 0 days.

(21) Appl. No.: 15/579,777

(22) PCT Filed: May 19, 2016

(86) PCT No.: PCT/EP2016/061329
§ 371 (c)(1),
(2) Date: Dec. 5, 2017

(87) PCT Pub. No.: WO2016/193017
PCT Pub. Date: Dec. 8, 2016

(65) Prior Publication Data
US 2018/0174730 A1 Jun. 21, 2018

(30) Foreign Application Priority Data
Jun. 5, 2015 (DE) .................... 10 2015 108 911.4

(51) Int. Cl.
*H01F 5/00* (2006.01)
*H01F 27/06* (2006.01)
(Continued)

(52) U.S. Cl.
CPC ............. *H01F 27/06* (2013.01); *H01F 17/04* (2013.01); *H01F 27/2804* (2013.01);
(Continued)

(58) Field of Classification Search
CPC ......... H01F 2017/006; H01F 2027/065; H01F 2019/085
(Continued)

(56) References Cited

U.S. PATENT DOCUMENTS 4,012,703 A * 3/1977 Chamberlayne ........ H01F 19/08
333/24 R
6,069,548 A * 5/2000 Baarman ............. H01F 27/2804
336/192
(Continued)

FOREIGN PATENT DOCUMENTS

DE 4137776 A1 5/1993
DE 102008059320 A1 6/2010
(Continued)

OTHER PUBLICATIONS

"International Search Report and the Written Opinion", International Patent Application PCT/EP2016/061329, dated Sep. 15, 2016, 19 pp.
(Continued)

*Primary Examiner* — Ronald Hinson
(74) *Attorney, Agent, or Firm* — Kaplan Breyer Schwarz, LLP

(57) ABSTRACT

A planar transformer for power transmission, having vertical and horizontal extents, includes a circuit board having a sandwich-type structure with at least three layers to form electrical conductors. First and second layers of these layers form outer layers of the circuit board, and each additional one of these layers forms an inner layer of the circuit board. An insulation material with a minimum thickness is arranged between all of these layers, with a number of at least three mutually galvanically isolated circuits. A first circuit forms a primary circuit and each additional circuit forms an equally entitled secondary circuit, having a magnetic core assembled from two interconnected magnetic core (Continued)

parts. A first core part with a central part and two outer legs forms a U shape. The circuit board has two recesses, and the two outer legs of the first core part are inserted into these recesses and connected to the second core part at their ends remote from the central part. A conductor is formed on at least one of the outer layers for exactly one single circuit of the at least three circuits, and a conductor of at least one circuit of the at least three circuits is wound around a first outer leg, and conductors of at least two additional circuits of the at least three circuits are wound around the second outer leg.

9 Claims, 13 Drawing Sheets

(51) Int. Cl.
| | |
|---|---|
| *H01F 27/28* | (2006.01) |
| *H01F 17/04* | (2006.01) |
| *H01F 27/29* | (2006.01) |
| *H01R 13/66* | (2006.01) |
| *H01R 13/7195* | (2011.01) |
| *H05K 7/02* | (2006.01) |
| *H01F 19/08* | (2006.01) |
| *H01F 17/00* | (2006.01) |

(52) U.S. Cl.
CPC ......... *H01F 27/29* (2013.01); *H01R 13/6675* (2013.01); *H01R 13/7195* (2013.01); *H05K 7/023* (2013.01); *H01F 2017/006* (2013.01); *H01F 2019/085* (2013.01); *H01F 2027/065* (2013.01); *H01F 2027/2819* (2013.01)

(58) Field of Classification Search
USPC ....................................................... 336/200
See application file for complete search history.

(56) References Cited

U.S. PATENT DOCUMENTS

| | | | |
|---|---|---|---|
| 6,996,892 B1* | 2/2006 | Dening | H01F 17/0013 29/602.1 |
| 7,741,943 B2* | 6/2010 | Fouquet | H01F 27/2804 336/200 |
| 8,193,781 B2* | 6/2012 | Lin | H02K 35/02 322/3 |
| 2004/0032313 A1* | 2/2004 | Ferencz | H01F 27/266 336/200 |
| 2006/0152326 A1* | 7/2006 | Fenner | H01F 27/2804 336/232 |
| 2007/0075818 A1* | 4/2007 | Hansen | H01F 38/14 336/200 |
| 2007/0139151 A1 | 6/2007 | Nussbaum | |
| 2012/0112866 A1* | 5/2012 | Matsumoto | H01F 27/22 336/61 |
| 2014/0375411 A1* | 12/2014 | Scholz | H01F 27/323 336/200 |
| 2016/0027570 A1* | 1/2016 | Sakamoto | H01F 27/2804 336/200 |

FOREIGN PATENT DOCUMENTS

| | | |
|---|---|---|
| DE | 102012003364 A1 | 8/2013 |
| DE | 102012016569 A1 | 2/2014 |
| JP | 2013175657 A | 9/2013 |
| WO | 2003003391 A1 | 1/2003 |
| WO | 2011047819 A1 | 4/2011 |

OTHER PUBLICATIONS

"German Office Action", German Patent Application 10 2015 108 911.4, dated Jan. 19, 2016, 12 pp.

* cited by examiner

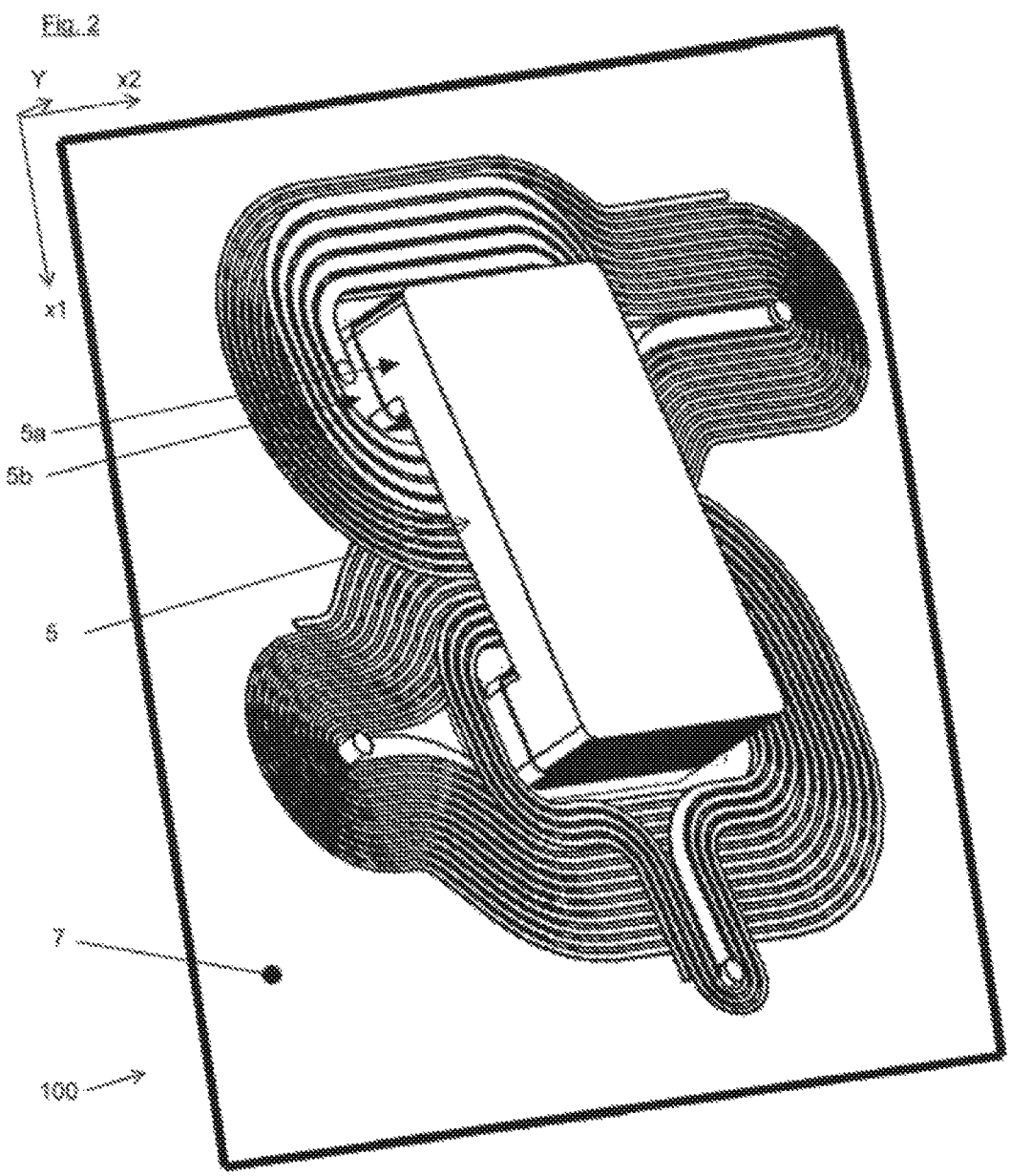

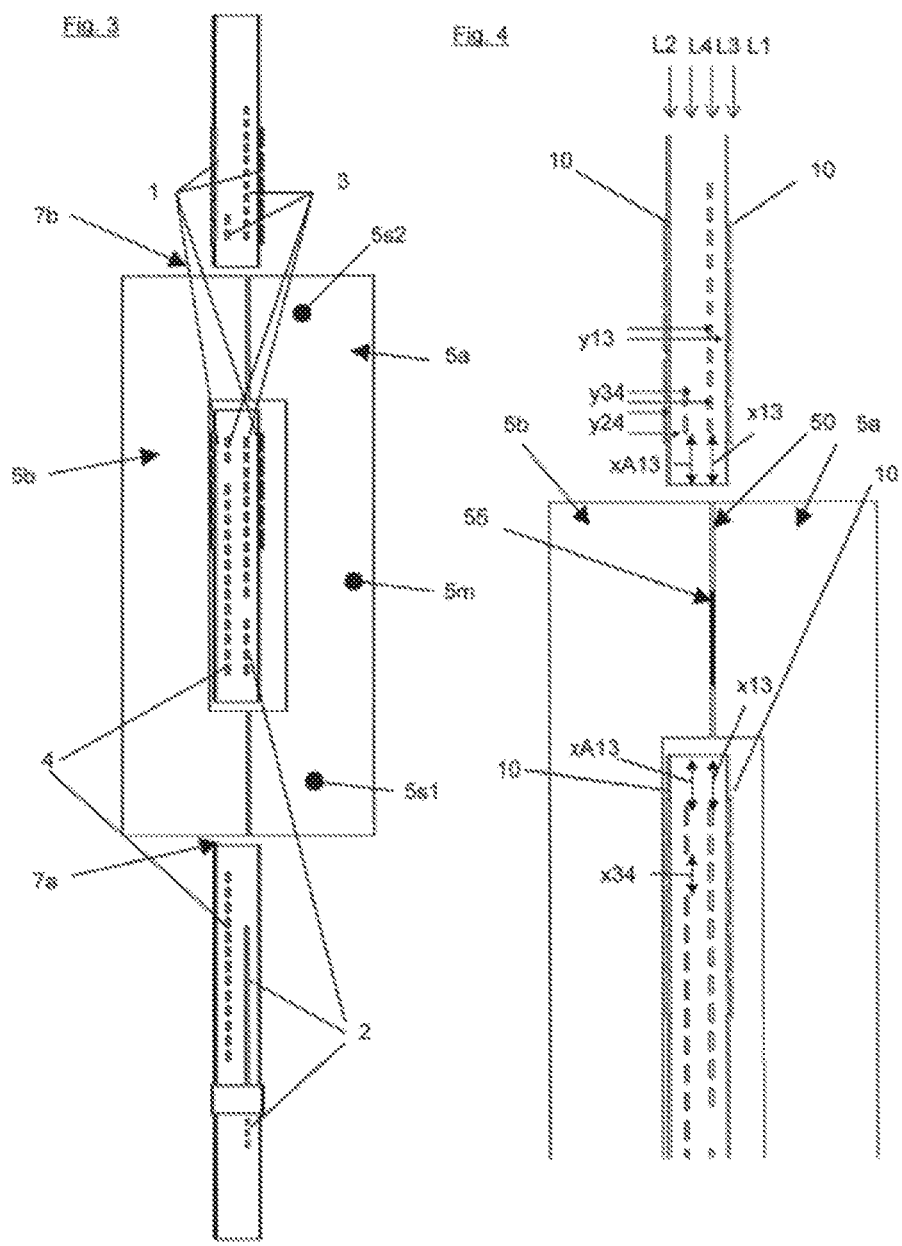

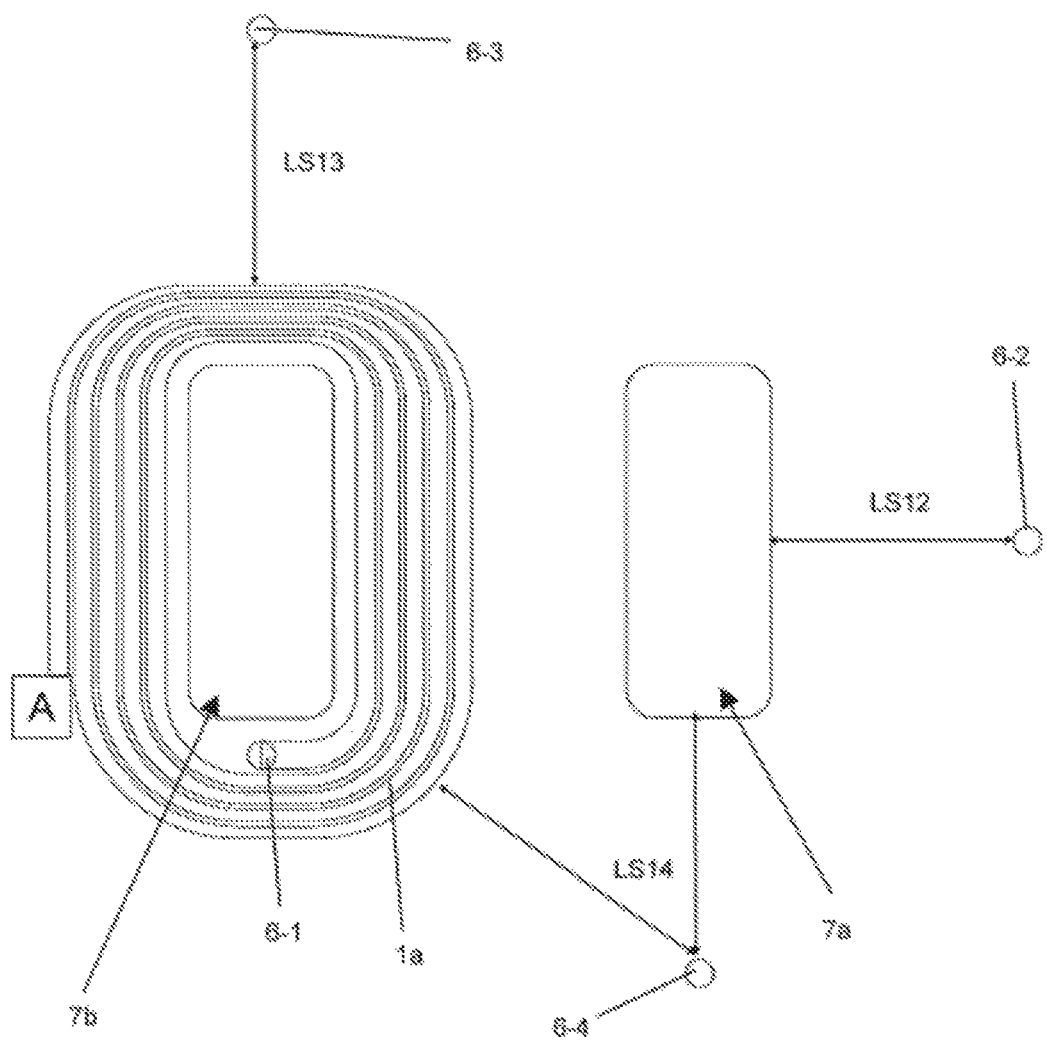

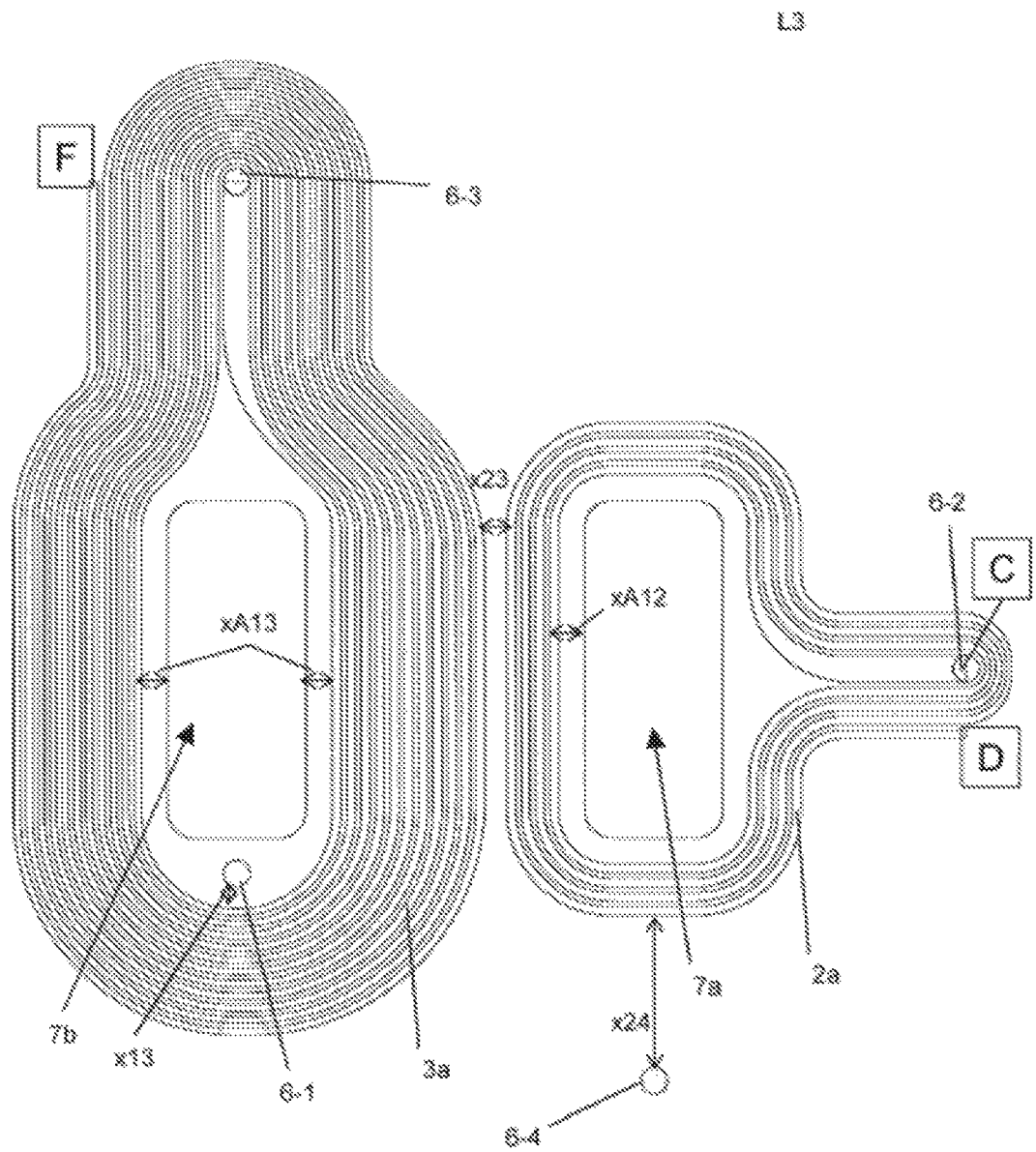

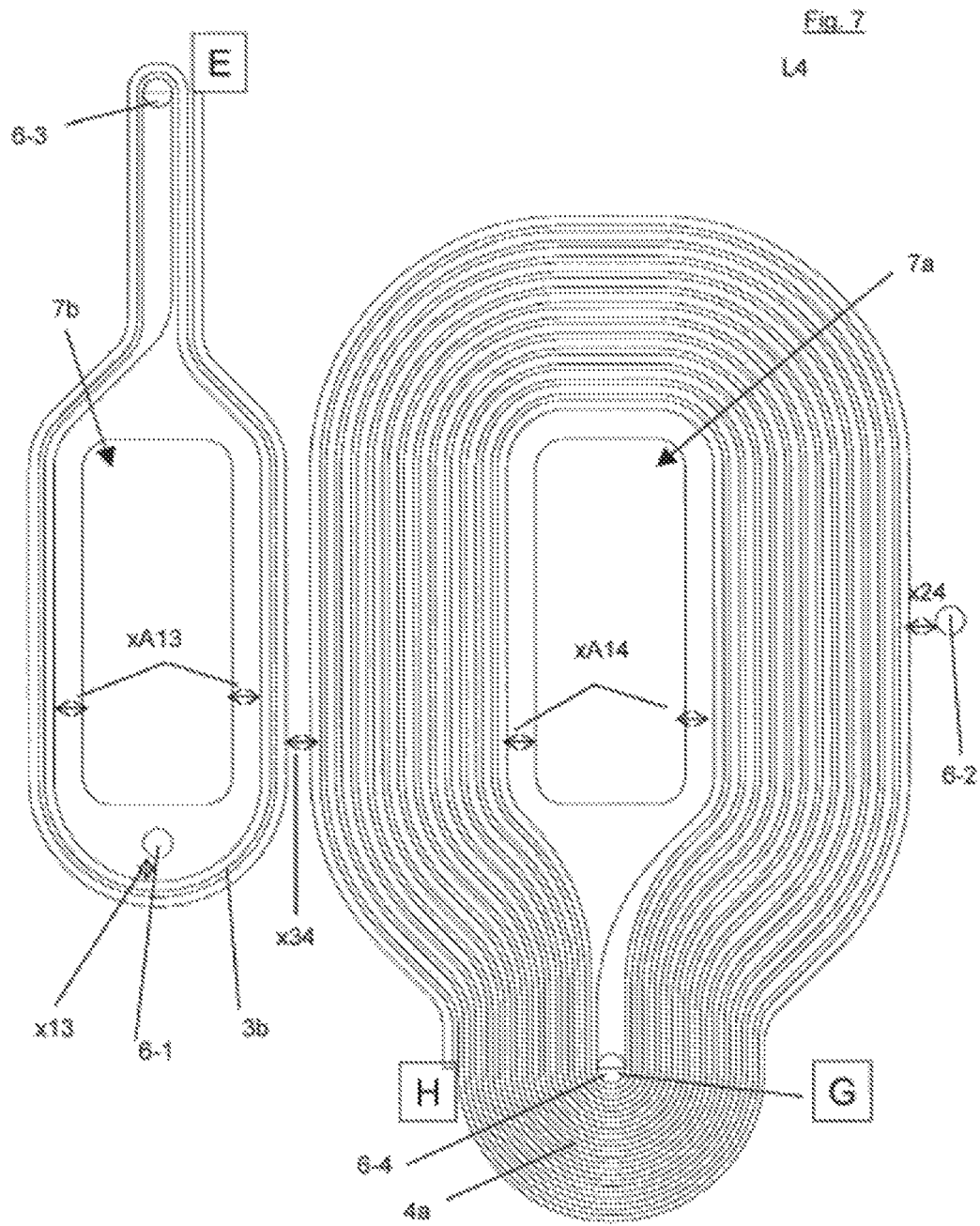

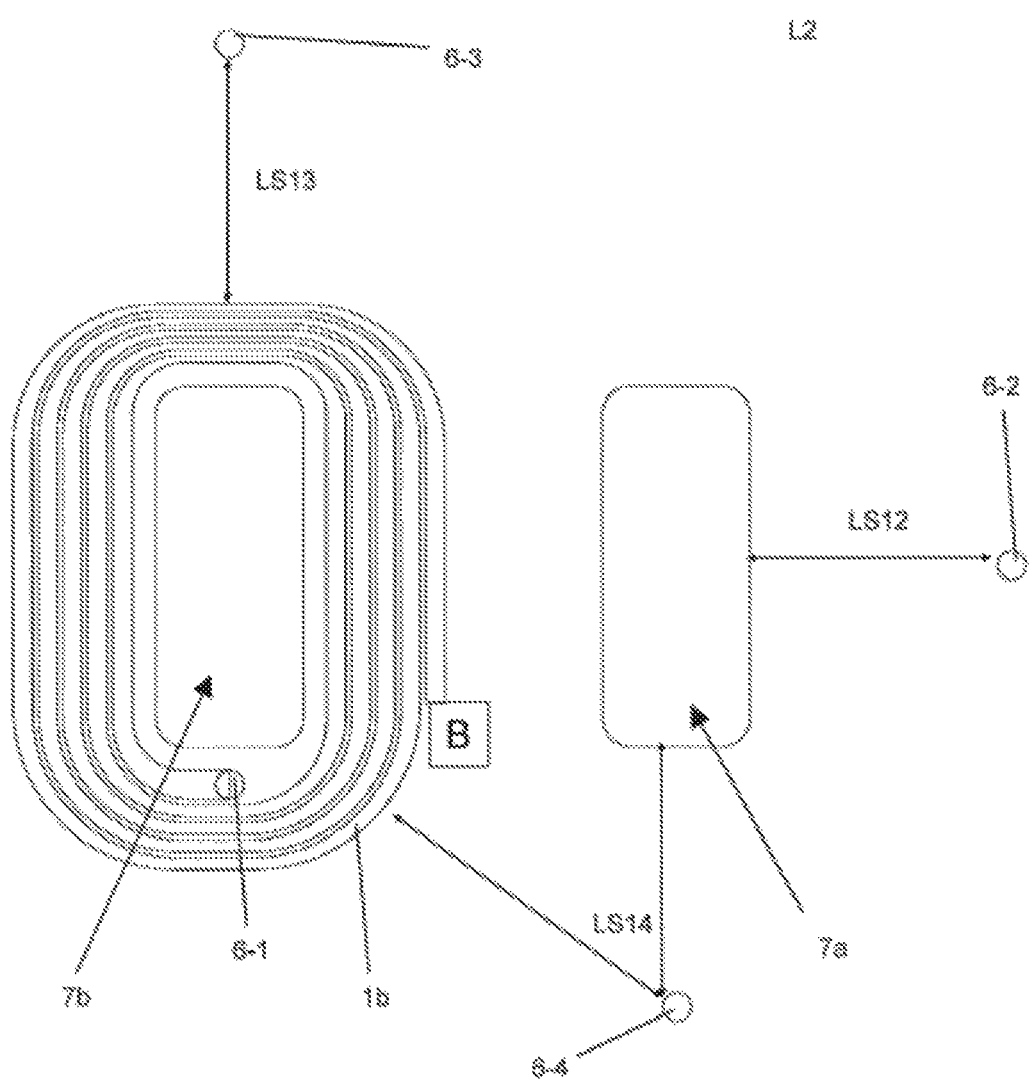

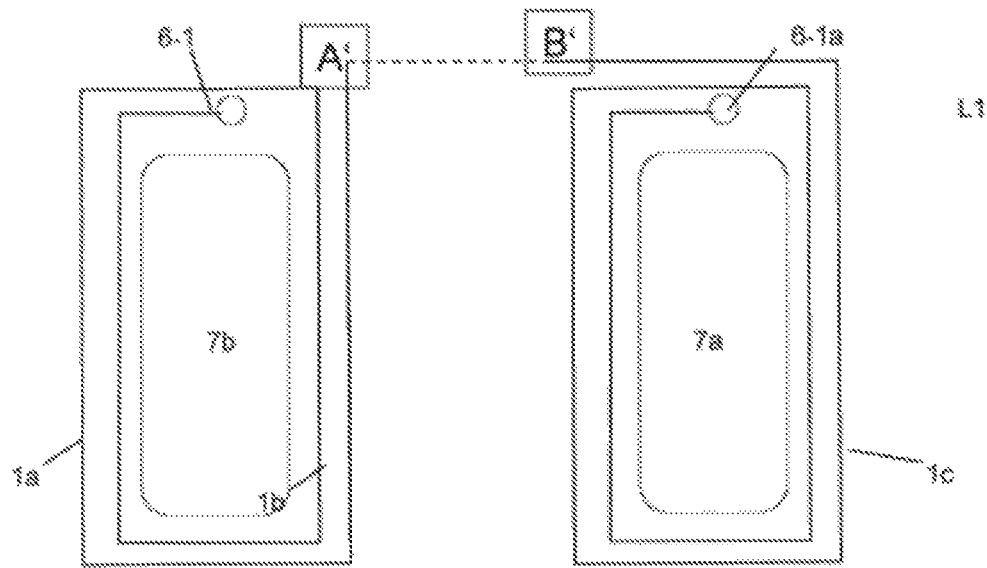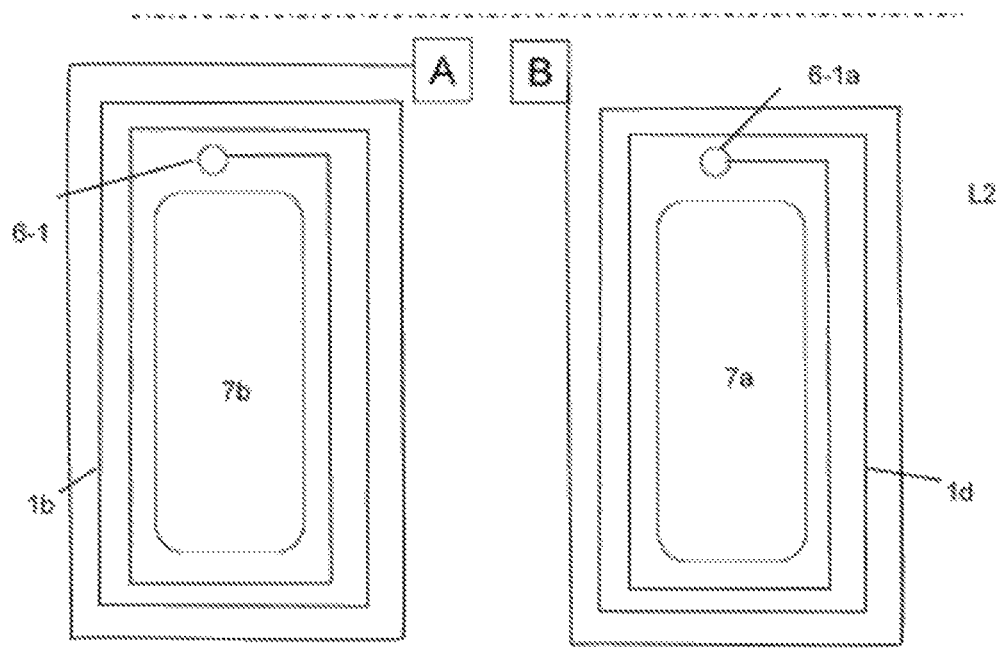

PLANAR TRANSFORMER FOR ENERGY TRANSFER

FIELD

The present invention relates to a planar transformer for power transmission.

BACKGROUND

Transformers are often used for galvanic isolation of electric circuits according to various standards, such that power, signals and/or data can be transmitted by means of such transformers, depending on their design.

Planar transformers, i.e., transformers characterized by a flat design because of a special structure, are used for power transmission, in particular as part of isolation amplifiers, which hereby provide galvanic isolation of multiple electrical circuits and/or can also connect different alternating voltage levels.

The attached FIG. 15 shows a greatly simplified block diagram relating to the use of a transformer inside an isolation amplifier for galvanic isolation between a primary circuit and at least one secondary circuit in signal processing of analog signals.

Accordingly, an input signal to be processed, in particular an analog input signal or an analog input current, which is to be processed during operation, is applied to the connection labeled as 1 accordingly and the connection labeled as 2 is connected to ground (GND1).

With respect to the signal processing chain diagrammed in FIG. 15, the analog input signal is usually sent to an input signal processing circuit, and the signal thereby processed is then applied to the primary circuit of a transformer adapted for signal transmission. The signal is tapped via the secondary circuit of the transformer and sent for output signal processing, comprising, for example, an amplifier circuit and optionally also a filter circuit before the output signal can be picked up at the end of the signal processing chain at the connection labeled as 5. The connection labeled as 6 is in turn connected to ground (GND2). Consequently, the circuits of the input signal processing and the circuits of the output signal processing can be galvanically isolated from one another by means of the transformer adapted for a signal transmission.

With respect to the power transmission, which is also diagrammed in FIG. 15, for supplying the required operating voltage as power to individual active circuits of the signal processing chain, another transformer, which is usually adapted for power transmission, is used for supplying the required operating voltage to individual active circuits of the signal processing chain; in the case illustrated here, this ensures galvanic isolation of one primary circuit and two secondary circuits. A power supply circuit that supplies an input voltage of 20V to 30V, for example, wherein the connection labeled as 8 is in turn connected to ground (GND3), is connected to the primary circuit of the transformer via the connection labeled as 7.

Power is then transmitted via one of the secondary circuits, for example, the input signal processing circuit, for the voltage supply by means of the other secondary circuit, for example, the amplifier circuit. Consequently, the currents thereby applied in the primary and secondary circuits are much greater than the currents applied in the circuits of a transformer adapted for signal transmission, which thus usually also results in a substantially increased production of heat. The production of heat is usually also greater, the smaller the dimensions of the transformer. However, this in turn counteracts the general trend toward a study miniaturization of electrical and electronic components. Consequently, although the heat generated by electronic components is frequently also emitted to the environment by convection, it is often no longer possible to ensure this in view of the volume-specific heating power of such components, which increases as a result of miniaturization, but this frequently also involves the assistance of ventilation openings, so the dissipation of heat can no longer be ensured and can result in a risk of exceeding the allowed component temperatures.

Furthermore, transformers for power transmission are often housed in equipment together with other electrical/electronic components, wherein a plurality of such devices are in term each arranged side by side next to one another, for example, along a carrier rail. This leads to a further substantial increase in the evolution of heat on the whole and consequently necessitates the use of additional heat dissipation elements, for example, including a cooling body located between two such devices as described, for example, in DE 10 2008 059 320 A1.

Depending on the field of use of such isolation amplifiers or similar amplifiers, an intrinsically safe galvanic isolation of individual circuits or all circuits may also be necessary for power transmission, for example, such as that with circuits, which must be supplied with power but are used in areas at risk of explosion in particular.

"Intrinsically safe" here means that the transformer is designed and optimized with regard to the geometry, so that the transformer is not susceptible to trouble for a certain level of protection, and specified isolation distances are ensured. This may fundamentally be ensured by wound coils as well as by coils printed or etched on circuit boards. In the case of printed or etched coils, it is advantageous that no additional winding operations are required and that good reproducibility can be ensured. Additional advantages may lie in a fundamentally improved thermal property in comparison with wound coils at the same core volume and the fact that manufacturing costs may turn out to be lower.

DE 41 37 776 discloses a high-frequency power transformer in a multilayer technology based on E-E core primary and secondary windings on different multilayer plates, each having a core hole to receive at least the middle leg of the core. Consequently, the circuit is limited in its horizontal extent by the two outer legs, and any separate circuits must necessarily be formed in different layers, which results in a great vertical extent, and this involves even larger dimensions accordingly when there is the necessity of dissipation of heat.

WO 03/003391 A1 discloses an E-I or E-E transformer, having two coils wound around the central web and two coils wound around the same outer leg. In this way, it is possible to implement two primary coils and two secondary coils such that the first primary coil and the secondary coil form a first transmission link and are arranged around the central web and the two primary coils and secondary coils form a second transmission link and are arranged around the outer web. This transformer is thus not suitable for applications in which power is to be transmitted from a primary circuit to two secondary circuits, such that a galvanic isolation, in particular an intrinsically safe isolation must be provided with all three circuits.

Furthermore, there are also known planar transformers (also called planar transmitters) in which individual windings or (partial) windings or entire circuits of the transformer are arranged side by side substantially in one plane. This permits a flat design, so that the transformer can also be integrated into devices with a low installation height, for example. Thus, the previous patent applications DE 10 2012 016 569 A1 and DE 10 2012 003 364 A1 by the present patent applicant, for example, describe planar transmitters having a layered structure with a plurality of circuits, wherein a first circuit may be a primary coil and galvanically isolated from a second circuit, which may be a secondary coil and may have at least one magnetic core. The first circuit and the second circuit are thus essentially in one horizontal plane and form a layer within the layer structure. Furthermore, in the case of the planar transmitter according to DE 10 2012 016 569 A1, at least one of the first circuit or the second circuit is subdivided into a plurality of circuits isolated galvanically from one another, wherein the circuits of the first circuit and/or of the second circuit, isolated galvanically from one another, are arranged one above the other in the vertical direction. In the case of the planar transmitter according to DE 10 2012 003 364 A1, the circuits each extend in the vertical direction into a plurality of partial circuits and the connecting elements are electrically connected to one another.

To maintain the specified isolation distances between the circuits, including their windings or (partial) windings as well as the distances from the magnetic core, according to the two previous patent applications, the windings or (partial) windings of the circuits are each formed on inner layers of the layer structure here and are guided outward for the electrical contacting through vias. For example, if a minimum insulation thickness TO of the insulation medium is stipulated as the isolation distance in a solid insulation medium between two galvanically isolated circuits, then the previous patent applications disclose teachings regarding the facts about and how this thickness between all the galvanically isolated circuits including their windings or (partial) windings is to be maintained, and the fact that (and how) just one-half of such a thickness from the magnetic core is to maintained.

The traditional procedure for designing the dimensions of planar transformers may thus be seen as positioning all the windings or (partial) windings one above the other around a common hole in the circuit board of a multilayer structure, such that the thickness of the individual insulation layers must be selected according to the insulation specifications. A magnetic core is passed through a central hole. To close the resulting magnetic circuit, typically two additional holes are created in this circuit board and the magnetic core is also passed through these. To close the magnetic circuit without dividing the circuit board, the magnetic core consists of two components, which are either glued or clamped together. The cores thereby used may be, for example, E cores or ER and/or EQ cores.

Due to the stratified arrangement of the windings or (partial) windings of circuits layered one above the other, a high main inductance and good coupling and/or a low stray inductance are achieved, which has positive effects on signal quality. One disadvantage that can be mentioned is that a complex circuit board technology must be used in case of high insulation requirements and a plurality of windings or (partial) windings of different circuits to be isolated galvanically.

This disadvantage can be overcome if the windings or (partial) windings are arranged partially side by side and partially one above the other. To this end, it is necessary only to create two holes in the circuit board, for example, by milling, through each of which a leg of a U-shaped magnetic core is introduced. Here again, the magnetic circuit is also closed by using two partial cores.

At least one winding or (partial) winding is placed around each hole. In this way, some of the insulation requirements can be shifted into the horizontal plane. As a result of this measure, the planar transformer becomes thinner and it is possible to use fewer layers, which is advantageous for reasons of cost. The possible disadvantage of a resulting lower coupling and/or greater stray inductance can often be compensated through the circuitry.

If planar transformers are needed for isolation amplifiers or similar functionalities, then special requirements are often made of the insulation properties of the transformers. This is manifested, for example, in air and creep zones of a few millimeters for insulation strength values in the kV range, which are regulated in special standards and specifications. However, there are also safety margins between the individually galvanically isolated windings within circuit boards. For example, the fact that two conductors belonging to different circuits or windings and arranged side by side on the same internal layer must maintain a minimum spacing of 0.4 mm from one another as regulated in the standard DIN EN 61010-1 for voltage classes up to 300V. There are also special requirements of the voltage strength of the individual insulation layers of the layer structure of the circuit board. This relates to two conductors of different circuits or windings, for example, which intersect one another on different layers. To maintain the insulation requirements, a certain minimum thickness of the individual insulation layers may result with the required insulation.

If planar transformers are to be dimensioned for use in the field of explosions, then the requirements must often be stricter. For example, conductors with solid insulation in the 375V voltage class and protection level ia, ib must not fall below a minimum value of 1 mm according to the DIN EN 60079-11 Standard. This is also true of conductors on internal layers of a circuit board in both the horizontal direction (side by side on the same layer) and in the vertical direction (one above the other on different layers with a layer of insulation in between).

Air and creep zones on the surface of the circuit board are referred to in the following description as LS, solid insulation in the horizontal direction is referred to "x" and in the vertical direction as "y." If there are several circuits with different insulation requirements, to further clarify the designation it is possible to use LSij for the insulation between circuit I, including its windings or coil, and circuit j, including is windings or coil. Thus, for example, LS23 would characterize the air and creep zone between circuit 2 and circuit 3.

Air and creep zones can be prevented and/or reduced to some extent by using special paints. Certain standards also regulate the fact that air and creep zones may also be split up so that, for example, a required air zone of 5 mm may be subdivided into two times 2.5 mm. This may be necessary, for example, because the magnetic core is assumed to be electrically conductive in principle. Thus, for example, the primary circuit may have an air and creep zone of 2.5 mm from the magnetic core and the magnetic core to the secondary circuit may also have an air and creep zone of 2.5 mm. The core is then at a virtual "intermediate potential."

SUMMARY

An essential object of the invention is to further improve the dissipation of heat with a planar transformer for power transmission, which should supply at least three circuits that are galvanically isolated from one another, and in particular to do so with improved utilization of the volume enclosed by the vertical and horizontal extent of a planar transformer to thereby expediently advance at the same time the further miniaturization of electrical and/or electronic components so that such a planar transformer can also be used in particular in isolation amplifiers, wherein additional cooling bodies may be omitted, preferably also with a neighboring arrangement of a plurality of devices having such isolation amplifiers, for example, along a carrying rail. Consequently, it is also the goal of the invention to supply a planar transformer with the greatest possible number of circuits that are galvanically "well" (i.e.: high insulation classes) isolated from one another including their windings or coils by using the least expensive possible circuit board technology.

The invention achieves the object in a surprising way by means of a subject matter having the feature of claim 1, wherein preferred embodiments are the subject matter of the dependent claims.

Accordingly, a planar transformer is provided for power transmission with a vertical extent and a horizontal extent, said transformer having a circuit board with a sandwich construction comprising at least three layers to form electrical conductors, wherein a first layer and second one of these layers forms outer layers of the circuit board and each additional one of these layers forms an inner layer of the circuit board and wherein an insulation material with a minimum thickness is arranged between each of these layers. Furthermore, a number of at least three circuits galvanically isolated from one another is included, wherein a first circuit forms a primary circuit, a second circuit forms a first secondary circuit and each additional circuit forms another equally entitled secondary circuit of the planar transformer, and wherein a current is fed into the circuit for power transmission via the primary circuit and an output current is obtained via the secondary circuits. A magnetic core includes at least partially the sandwich type structure and acts at least on the first, second and third circuits. The magnetic core is made up of two magnetic core parts connected to one another, wherein a first core part forms a U shape with a central part and two outer legs, and wherein the circuit board has two recesses and the two outer legs of the first core part are inserted into these recesses and they are connected to the second core part at their ends remote from the central part. For exactly one single circuit of the at least three circuits, a conductor is formed on at least one of the outer layers and for all the other ones of the at least three circuits, conductors are formed on an inner layer or on a plurality of inner layers such that a conductor is guided from at least one circuit of the at least three circuits around a first outer leg//is coiled around the leg and printed circuits// conductors of at least two additional circuits of the at least three circuits are wound around the second outer leg.

An expedient embodiment provides that for at least two additional circuits of the at least three circuits, conductors are formed on one end the same inner layer.

An expedient embodiment provides that at least one end is electrically connected to a via for each conductor formed on a layer to form electric conductors, said via being electrically connected to a connection arranged in another layer for electrical contacting of the conductor.

An expedient refinement provides that the via is passed completely through all the layers of the circuit board and is lined with electrically conductive material.

A supplementary or alternative embodiment provides that a predetermined minimum distance of an air zone and a creep zone between two circuits defines the minimum distance between the via of one circuit and the edges of the two recesses.

Another supplementary or alternative refinement provides that a via belonging to a conductor coiled around an outer leg is always arranged in the interior of the conductor coiled around the outer leg.

Additional expedient embodiments provide that conductors are wound around both legs for at least of the circuits and/or conductors are formed on two different layers.

According to the invention, another exemplary embodiment provides that the planar transformer is integrated into the housing of an isolation amplifier.

Additional expedient embodiments provide that at least one conductor formed on an outer layer is covered by a protective coating and/or the core is to be assigned to the potential of the conductor formed on an outer layer with respect to the galvanic isolation of the circuits.

Consequently, a standard multilayer structure may be considered for the circuit board technology, typically in particular with four or six layers. The thicknesses of the insulation layers are selected according to the insulation requirement. Thus, for example, it may happen that an insulation layer is assembled from a plurality of partial layers.

In the case of such a layer structure in the standard circuit board technology, there are conductive inner layers and outer layers that are isolated from one another by insulation layers.

The insulation layers may be, for example, cores or so-called "prepregs" (pre-impregnated fibers). Preferably all the layers are connected to one another by conductors of a common circuit between different layers by means of vias (vias).

Within the scope of the invention, especially preferably only those with "normal" vias are used. However, there are also other contact possibilities that go only from a certain layer to another layer in particular a layer next to a certain layer.

However, such technologies are more complicated to manufacture and are also more expensive.

When using the preferred standard technology with the vias through all layers, such that said vias are consequently also expediently lined completely with electrically conductive material, the invention here takes into account in an expedient embodiment the fact that minimum distances are optionally also maintained from these vias. For example, if the two partial windings are connected to each other on layers 1 and 4 in the case of a winding arranged in a four-layer construction with a respective partial winding on the outside layer 1 and on the outside layer 4, then the vias also pass through the layers 2 and 3. Thus in practical implementation of the invention, another winding, which is arranged on the inside layer 2, for example, maintains a minimum distance from the via. Thus, for example, a certain region on the circuit board cannot be utilized. On the other hand, the first winding must also maintain a safety margin (air and creep zone) from each via of the second winding because for the second winding, each via is expediently also present on the outer layers.

Consequently, the invention makes it possible to use the lowest possible number of layers, wherein the layer structure can also be expanded to a 4-, 5-, 6-, 7-, 8- or even more layer structure and thus additional interlayers and also insulation layers are added.

Another relevant aspect is the preferred use of a protective coating, in particular a solder stop coating. If conductors are formed on outer layers to form windings of a circuit of the planar transformer, then it may happen that the magnetic core is situated in the immediate vicinity of these conductors.

Expedient specific embodiments of the invention even provide that this magnetic core is situated directly above these conductors and/or is even secured adhesively there. Since the magnetic core may have a certain electrical conductivity (although it is typically poor) and this conductivity is in turn poor for function because of the resulting eddy currents and glosses, then this magnetic core is not considered to be an insulator within the scope of the invention. In order for the core not to be able to directly short circuit the individual windings of a coil, a protective coating is thus preferably used, in particular a solder stop coating is preferably used. This ensures a corresponding insulation of the (partial) winding arranged on an outer layer in comparison with the magnetic core situated directly above it. However, the protective coating often has rather low insulation properties, so it is not included in the calculation of the insulation properties within the scope of the invention. As a result, the magnetic core is expediently at the same potential in the calculations as the (partial) winding placed on outer layer. This then in turn results in only the windings of a single coil being applied to the two outer layers because the core is located in direct proximity to both outer layers, and the insulation properties of a protective coating are usually not sufficient to insulate two coils from one another. However, if only the windings of a single coil are situated on the outer layers, then the potential of the magnetic core is assigned to this coil within the scope of the invention and there is a single potential from which all the other coils must maintain corresponding air gaps and creep gaps on both outer layers in the area of the core, the respective holes and the conductors on the outer layers. This is explained in greater detail in the following exemplary embodiments.

Essential advantages and features of the invention may thus be seen as the fact that very flexible planar transformers with multiple coils and individual insulation requirements can be generated with just a few layers (typically four, max. six) and standard circuit board technology and a "simple" U core. Thus, for example, it is possible for the first time to implement a four-fold transmitter with a single core and a four-layer layout.

BRIEF DESCRIPTION OF THE DRAWINGS

These and other advantages and features of the invention can also be seen on the basis of the following description of a few exemplary embodiments with reference to the accompanying drawings, in which:

FIG. 2 shows a schematic view of a planar transformer according to the invention for implementation of the equivalent circuit diagram according to FIG. 1 and with the circuit board kept transparent for reasons of illustration, FIG. 3 shows a schematic sectional view through the planar transformer according to FIG. 2, FIG. 4 shows a schematic detailed view of the sectional view according to FIG. 3, FIG. 5 shows a schematic view in the direction opposite the y direction according to FIG. 2, showing a circuit board layer of the planar transformer according to FIG. 2, forming a first outer layer of the circuit board, FIG. 6 shows a schematic view in the direction opposite the y direction according to FIG. 2, showing a circuit board layer of the planar transformer according to FIG. 2, forming a first inner layer of the circuit board, FIG. 7 shows a schematic view in the direction opposite the y direction according to FIG. 2, showing a circuit board layer of the planar transformer according to FIG. 2, forming a second inner layer of the circuit board, FIG. 8 shows a schematic top view in the direction opposite the y direction according to FIG. 2, showing a circuit board layer of the planar transformer according to FIG. 2, forming a second outer layer of the circuit board, FIG. 9 shows a schematic top view of an embodiment, which is modified in relation to the arrangement according to FIGS. 5 and 8, showing conductors coiled onto the outer layers of a circuit board within the scope of the invention.

All the figures show equivalent circuit diagram not drawn to scale. Similar elements or identical elements are labeled with the same reference numerals in the figures.

On the basis of FIG. 1 through 8, preferred specific embodiments according to the invention will first be discussed in detail below.

DETAILED DESCRIPTION

Figure 1:
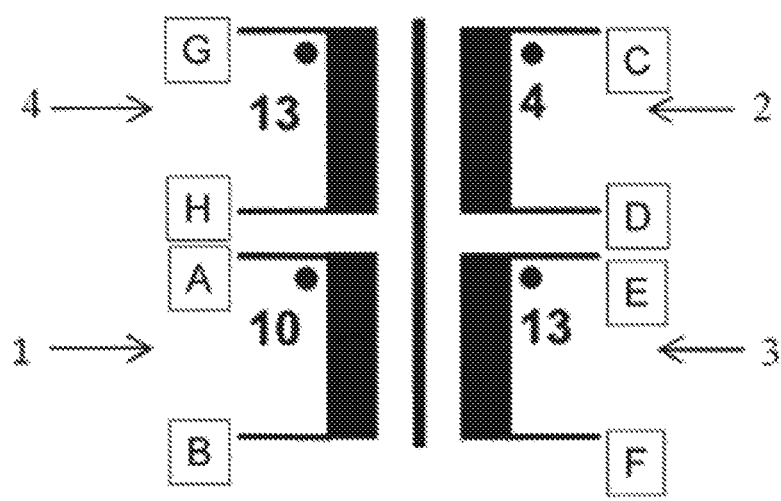
FIG. 1 shows an equivalent circuit diagram of a transformer comprising four circuits.

A preferred specific embodiment of a planar transformer for power transmission according to the invention should implement, for example, the equivalent circuit diagram of a transformer as shown in FIG. 1.

Accordingly, the coil of a first circuit 1 should comprise ten windings, for example, and should form a primary circuit of the planar transformer for feeding in current for the power transmission. The coil of a second circuit 2 should comprise four windings, for example, and should form a first secondary circuit of the planar transformer for dissipating the current.

The coil of the third circuit 3 should comprise thirteen windings, for example, and should form a second secondary circuit of the planar transformer for tapping the current. According to the equivalent circuit diagram according to FIG. 1, a fourth circuit 4, for example, a coil with 13// thirteen windings should be included in an expedient embodiment and should form a third secondary circuit of the planar transformer for discharging the current.

Thus, starting from the primary circuit (circuit 1) and moving to the secondary circuits (circuits 4, 2 and 3) going clockwise, a four-way transformer can be implemented in the winding ratio 10:13:4:13. Current here is fed into one "way" and taken from three "ways" for power transmission, i.e., power is transmitted from a primary circuit to three secondary circuits within the scope of the invention. A sandwich-type design of a circuit board with four layers is sufficient here to form electric conductors. All the windings of the circuits should also be designed for intrinsically safe isolation of 300V according to DIN EN 61010 and to have a test voltage of 3 kV in a preferred embodiment. This results in an air and creep zone LS of 5.2 mm between all four windings, i.e., LS12=LS13=LS14=LS23=LS24=LS34=LS=5.2 mm, wherein:

LS12 denotes the air and creep zone between circuits 1 and 2,

LS13 denotes the air and creep zone between circuits 1 and 3,

LS14 denotes the air and creep zone between circuits 1 and 4,

LS23 denotes the air and creep zone between circuits 2 and 3,

LS24 denotes the air and creep zone between circuits 2 and 4 and

LS34 denotes the air and creep zone between circuits 3 and 4.

The letters A through F in FIG. 1 denote the respective free connections for electrical contacting of the windings from the outside.

An expedient design of a planar transformer corresponding to the equivalent circuit diagram in FIG. 1 for power transmission according to the invention can be derived from FIGS. 2 through 8.

FIG. 2 shows a schematic view of such a planar transformer according to the invention, labeled with reference numeral 100 as the whole.

The planar transformer 100 for power transmission as a vertical extent, in particular along the direction labeled as Y according to FIG. 2, and a horizontal extent, in particular along the direction labeled as x1 and along the direction labeled as x2 in FIG. 2.

The planar transformer 100 has a circuit board 7 with a sandwich-type design having at least three layers to form electrical conductors such as those shown in FIGS. 3 to 8 in particular. A first and a second one of these layers, for example, the layers L1 and L2 according to FIG. 2, form the outer layers of the circuit board, and each additional one of these layers, for example, the layers L3 and L4 according to FIG. 4, forms an inner layer of the circuit board. There is suitable insulation material with a certain minimum thickness separating all of these layers, wherein the teachings from DE 10 2012 003 364 A1 and/or DE 10 2012 016 569 A1 in this regard are included along with the knowledge of those skilled in the art for the disclosure content within the context of the present invention.

FIG. 5 shows a schematic view opposite the y direction according to FIG. 2 of the circuit board position L1 of the planar transformer forming the first outer layer of the circuit board in the present example; FIG. 6 shows a schematic view in the direction opposite the y direction in FIG. 2 showing the circuit board layer L3 of the planar transformer forming a first inner layer of the circuit board in the present example; FIG. 7 shows a schematic view in the direction opposite the y direction according to FIG. 2 of the circuit board L4 of the planar transformer forming a second inner layer; and FIG. 8 shows a schematic view in the direction opposite the y direction according to FIG. 2 of the circuit board layer L2 of the planar transformer forming the second outer layer of the circuit board in the present example.

As indicated by FIGS. 2 through 4 in particular, a magnetic core labeled with reference numeral 5 as a whole encloses at least partially the sandwich-type structure. The magnetic core 5 is assembled from two magnetic core parts joined together, wherein a first core part 5a together with a central part 5m and two outer legs 5s1 and 5s2 extending away from this central web form a U-shaped structure, such that this U shape may also develop into a C shape or a V shape in particular within the scope of the invention. The circuit board 7 has two recesses 7a and 7b formed in it, and the two outer legs 5s1 and 5s2 of the first core part are inserted into these recesses. The second core part 5b is connected to the first core part 5a at the ends of the outer legs 5s1 and 5s2 that are separated a distance from the central web 5m.

In the present example, the second core part 5b is U-shaped, so that in this case, the two core parts 5a and 5b are each expediently connected to one another by means of the ends of the outer legs, which are a distance away from the central part. For those skilled in the art, it is possible to see that the outer legs 5s1 and 5s2 therefore need not penetrate completely through the recesses 7a and 7b, but instead the respective interconnected outer legs may also be connected to one another within the sandwich-type circuit board structure, as shown in FIGS. 3 and 4, for example. Alternatively, the second core part 5b may also have just one elongated web or one plate and may be approximately I-shaped. In this case, the two core parts 5a and 5b would be connected to one another by the elongated web of the second core part by means of the ends of the outer legs 5s1 and 5s2 at a distance from the central part 5m, wherein the outer legs 5s1 and 5s2 will then expediently penetrate completely through the recesses 7a and 7b.

FIGS. 2 through 8 indicate that the planar transformer shown here has a number of three circuits 1, 2, 3. These circuits are also each isolated galvanically from one another, in particular being galvanically isolated in an intrinsically safe manner in a preferred embodiment according to the preceding discussion of FIG. 1. Consequently, a first circuit 1 may form a primary circuit, a second circuit 2 may form a first secondary circuit, and the third circuit 3 may form a second secondary circuit, which is equally authorized in addition to the first secondary circuit, wherein the magnetic core 5 acts at least on the first circuit 1, the second circuit 2 and the third circuit 3. Consequently, current can be fed over the primary circuit and an output current can be picked up via the equally entitled secondary circuits for the purpose of power transmission in particular. The feed and the discharge of current take place in particular by means of the free connections for electric contacting of the windings. In the case of the planar transformer illustrated in FIGS. 2 through 8, a fourth circuit 4 is also formed for implementing the equivalent circuit diagram according to FIG. 1 in such a way that, in the present example, it forms an additional secondary circuit, which is equally entitled to the first two secondary circuits. The magnetic core 5 in this case thus acts at least on the first circuit 1, on the second circuit 2, on the third circuit 3 and on the fourth circuit 4.

For exactly one single circuit, a conductor is formed on at least one of the outer layers, namely for circuit 1 according to the specific embodiment illustrated here. It should be pointed out here that external feeder lines on external layers, which are also provided as conductors, for example, which are far enough apart from one another are not taken into account, for example, a terminal contacting on the outer layer at via 6-2 on connection C.

Specifically, in the present example, the ten windings of the coil of this circuit 1, which serves as a primary circuit, are arranged on the two outer layers L1 and L2. There are five windings on layer L1 and five windings on layer L2. A conductor 1a is formed on the layer L1 for the arrangement of the first five windings thereon accordingly. A conductor 1*b* is formed on the layer L2 for the other five windings on the layer L2 accordingly. The conductor 1*a* is guided from the connection A, which is guided outward (FIG. 5) to via 6-1, and the conductor 1*b* is guided from the via 6-1 to the connection B, which is guided outward (FIG. 8). The via 6-1 leads from the layer L1 through the entire circuit board to the layer L2 and is expediently lined completely with electrically conductive material for the sake of simplicity. Consequently, both partial coils, i.e., the partial coil comprising five windings on layer L1 and the partial coil comprising five windings on layer L2 of circuit 1 are connected to one another by means of the via 6-1 over all layers and are connected in series. The circuit can be contacted electrically at the connections A and B, which lead outward to a circuit (not shown in the figures for reasons of simplicity), which belongs to the circuit 1, wherein the current flow is thereby predefined in this way for implementing the equivalent circuit diagram according to FIG. 1 from, for example, connection A in the direction of connection B, for example. It should be pointed out here that the current flow need not necessarily go from A to B (alternating signals). The points in the equivalent circuit diagram characterize only the direction of the coil. If the direction of the coil is in the same direction, the result is a positive signal flank on one coil and a positive flank on the other coil. If the direction of the coil is the opposite, the result is a positive signal flank on one coil and a negative signal flank on the other coil and vice versa.

Furthermore, conductors on an inner layer or a plurality of inner layers are formed for all additional circuits of the at least three circuits, i.e., for the circuits 2, 3 and 4 according to the present embodiment.

According to the specific embodiment shown here, one conductor 2*a* and/or 3*a* is formed on each layer L3, for example, as also shown in FIG. 6, for each of the circuits 2 and 3. The conductor 2*a* of the circuit 2 is guided here on the layer L3 between a via 6-2 arranged in the interior of the windings formed by the conductor 2*a* and the connection D guided outward on the layer 3 (FIG. 6). The conductor 3*a* of the circuit 3 is guided here between a via 6-3 arranged in the interior of the windings formed by the conductor 3*a* and the connection F, which is guided outward on the layer 3 (FIG. 6). The vias 6-2 and 6-3 are expediently guided from layer L1 to layer L2 through the entire circuit board for the sake of simplicity and are lined completely with an electrically conductive material. The conductor 2*a* of the circuit 2 also forms all four windings on the layer L3 so that the via 6-2 also provides a connection C on one of the outer layers, for example, at the same time. The circuit 2 can be contacted electrically to the connections C and D by another circuit (not shown in the figures for the sake of simplicity) belonging to the circuit 2, wherein the current flow is predetermined, for example, from connection C in the direction of connection D for implementation of the equivalent circuit diagram according to FIG. 1, wherein the current flow again need not necessarily go from C to D here.

The conductor 3*a* of circuit 3 also forms only eleven windings on the layer L3.

As can also be seen from the figures, in the embodiment shown here a conductor of at least one circuit of the at least three circuits is wound around a first outer leg in the embodiment shown here and conductors of at least two additional circuits of the at least three circuits are wound around the second outer leg. For example, the conductor 2*a* of the circuit 2 is wound around the outer leg 5*s*1, which is inserted into the recess 7*a* and the conductor 1*a* of the circuit 1 as well as the conductor 3*a* of the circuit 3 are wound around the outer leg 5*s*2, which is inserted into the recess 7*b*.

Furthermore, according to the specific embodiment shown here a conductor 3*b* and/or 4*a* is formed on the layer L4, for example, for circuits 3 and 4, as can also be seen in FIG. 7. The conductor 3*b* of circuit 3 is guided on the layer L4 between the connection E, which is guided outward on layer L4, and the via 6-3 (FIG. 7). Consequently, both the windings formed by the conductors 3*a* and 3*b* and the partial coils of the circuit 3 are connected to one another by means of the via 6-3 and are connected in series. The circuit 3 can be electrically contacted to the connections E and F with a respective circuit (not shown in the figures for reasons of simplicity), wherein the current flow is therefore provided from connection E in the direction of terminal direction F, for example, for implementation of the equivalent circuit diagram according to FIG. 1, wherein, here again, the current flow need not necessarily go from E to F.

The conductor 4*a* of the circuit 4 is guided between a via 6-4 disposed in the interior of the windings formed by the conductor 4*a* and the connection H, which is guided toward the outside on the layer L4 (FIG. 7). The conductor 4*a* of the circuit 4 thus forms all four windings on the layer L4, so that the via 6-4 also provides the connection G at the same time, for example, on one of the outer layers. The circuit 4 can be electrically contacted to the connections G and H with another circuit, which belongs to the circuit 4 and is not shown in the figures for reasons of simplicity, wherein the current flow is thereby predetermined from the connection G in the direction of the connection H, for example, for implementation of the equivalent circuit diagram according to FIG. 1, wherein, here again, the current flow need not necessarily go from G to H.

In determining the dimensions of the conductor, attention is preferably paid, on the one hand, to the fact that conductors as wide as possible are to be used, so that the ohmic losses are as low as possible, while, on the other hand, the conductors in turn must not be designed to be too wide, so that the greatest possible space-saving planar transformer design can be implemented, and stray fields do not become too large. With respect to the distance between two neighboring conductors, as a rule, the minimum distance allowed technologically is basically what is selected. This rule also holds for the distance between conductors and the edges, for example, a milled contour, of the recesses 7*a* and 7*b*. This is also true according to the invention for the circuit, for which a conductor is formed on at least one of the outer layers, i.e., for the circuit 1 according to the specific embodiment shown here, for which a conductor is formed on at least one of the outer layers.

However, a conductor on an outer layer, and thus the conductors 1*a* and 1*b* on the outer layers L1 and L2 of the electric circuit 1 according to the embodiment shown here, are preferably coated with a protective coating 10 according to the invention, for example, a solder stop coating (cf. FIG. 4), which provides insulation between the respective conductor of an outer layer and the respective area of the core part 5*a* and/or 5*b* of the core 5 on the sides of this outer layer.

The two core parts 5*a* and 5*b* are also preferably glued together by means of an adhesive 55, wherein another type of connection, for example, clamping, is also possible, and there may be an air gap 50, which should, however, expediently be kept small in the area of the contact surface. Furthermore, expediently at least one of the core halves is attached to the circuit board 7 by adhesive bonding, i.e., the core half, wherein a mechanical stability is first achieved as a result of this adhesive bonding and vibrations can be prevented.

Furthermore, however, due to the adhesive bonding of the magnetic core 5 to the circuit board 7, the insulation between the windings formed by a conductor on the corresponding exterior position are very minor according to the embodiment illustrated here, in particular between the windings 1*b* and the core 5*b*, because the conductors on the layer L2 are surrounded only by the protective coating 10. However, a high dielectric strength of the protective coating cannot be ensured because such a protective coating usually has a thickness in the range of only approx. ≧5 µm. According to the invention, the insulation provided by the protective coating 10 is therefore not also taken into account in the calculations for the insulation between the windings, and the magnetic core 5 is associated with the potential of the windings on the outer layer. Thus, the windings of all the other circuits must include not only the air and creep zones LS12, LS13, LS14 for the conductor on each outer layer but also those for the magnetic core 5.

Based on the embodiment illustrated, the conductors and the windings of the circuits 2, 3 and 4 thereby formed must include not only the air and creep zones LS12, LS13, LS14 for the conductors 1*a* and 1*b* but also those for the magnetic core 5. If vias passing completely through the circuit board are provided in the circuit board according to the preferred embodiments, then these are to be assigned additionally to the potential of the respective circuits including these vias. For such vias, thus the air and creep zones must be maintained at least in the regions lined with electrically conductive material.

In the embodiment illustrated here, in which thus only vias 6-1, 6-2, 6-3 and 6-4, which are completely lined with electrically conductive material and are thus only passed through the entire circuit board, are preferably provided, a distance from the conductors 1*a* and 1*b* and from the magnetic core 5, which is sufficient for the air and creep zones LS12, LS13, LS14, must thus also be maintained in the positioning of the vias 6-2, 6-3 and 6-4. In order for the magnetic core 5 to be able to assume slightly different arrangements in the recesses and/or holes 7*a* and 7*b* because of possible tolerances, these air and creep zones in the windings are all circuits that are not associated with the potential of the windings on the outer layer, i.e., are maintained with the windings of circuits 2 through 4 and also expediently with respect to the edges of the recesses 7*a* and 7*b* according to the embodiment shown here because these recesses represent the limiting "barriers" for the magnetic core. If one of the two core parts is designed only as an elongated web or as a plate, this can result in even greater position tolerances.

Thus, this core part, for example, can protrude further beyond the recesses and may make it necessary to further increase the safety margin around the core, if necessary. The aforementioned air and creep zones are then expediently maintained in relation to the core part ends protruding further beyond the recesses.

The circuits 2 through 4 and thus their conductors and/or windings can therefore no longer be placed on the outer layers based on the design of conductors according to the invention for only a single circuit on at least one of the outer layers, in particular in such a way that the magnetic core 5 is to be associated with the potential of this circuit in the calculations. In the example illustrated here, these outer layers are blocked by the circuit 1, in particular by the conductor 1*b* of the circuit 1 on the layer L2. This is also true of the outer leg 5*s*1 in the recess 7*a* for the reasons given above, although no conductors of the first circuit 1 are arranged around this outer leg on the outer layers.

Consequently, all the conductors of additional circuits are distributed on the inner layers. However, since the assembled magnetic core is a closed magnetic circuit, at least an essentially closed magnetic circuit, the conductors may both be placed around the leg 5*s*1 with the respective hole 7*a* as well as around the other leg 5*s*2 with the respective hole 7*b* to form the respective windings. It should be pointed out here that this may result in slightly different electrical and magnetic properties, depending on whether conductors of two different windings are opposite one another on one leg or are arranged side by side on different legs. Whereas a stronger magnetic and capacitive coupling is established in the former case, this is somewhat diminished in the case in which the conductors are arranged side by side. However, these properties can be taken into account in the context of the technical circuitry. Therefore, this will not be discussed further within the context of the present invention. However, it may be advisable, for example, to place several secondary sides of a secondary circuit or different secondary circuits whose clock flanks must be synchronized as well as possible, directly one above the other. "Directly above one other" within the scope of the invention here means that the corresponding conductors are carried on different layers largely directly one above the other and/or the corresponding windings are wound around the same outer leg on different layers. The better the placement of the secondary circuits directly one above the other, the more optimum is the coupling.

As already mentioned above, the coil of the circuit 3 comprising thirteen windings is placed asymmetrically around the hole 7*b* on the two inner layers L3 and L4 while the coil of the circuit 4 comprising thirteen windings is placed on the inner layer L4 around the hole 7*a*, and the coil of the circuit 2 comprising four windings is placed on the inner layer L3 around the hole 7*a*. Thus, all the layers are utilized as well as possible and the ohmic resistances of the individual circuit ends are minimized.

In the specific embodiment illustrated in FIGS. 2 through 8, the conductors 3*a* and 3*b* for forming the 13 windings of the circuit 3 are now distributed asymmetrically on the layers L3 and L4 and placed around the hole 7*b*. Thus, the first eleven windings are arranged on the layer L3, in particular in a spiral pattern, and expediently the innermost winding is connected to the via 6-3. Since this in turn extends over all layers because of the preferred technology, the outer layers are also affected and the air and creep zone LS13 from here must be maintained for 5.2 mm to the conductors 1*a* and 1*b* of the windings of the circuit 1 on the two outer layers L1 and L2 (see also FIGS. 5, 8). For this reason, all eleven windings of the circuit 3 arranged on the layer L3 are expediently "pulled outward" as far as possible, i.e., also passed around the via 6-3. Due to this measure, the result is again a larger scattering field but that can still be taken into account technically. The two remaining windings of the circuit 3, which are placed on layer L4 by means of the conductor 3*b*, are also connected to the via 6-3. The conductor 3*b* and/or the windings thereby formed are likewise expediently guided around the via 6-3.

As already mentioned above, in one embodiment according to the invention, the insulation properties are to be taken into account for the conductor in practical implementation. Thus, the conductors of all the circuits with windings are placed only on the inner layers and only as close to the holes 7*a* and 7*b*, in particular their edges or their milling contours, such that the minimum value for the solid insulation is maintained in each case. The magnetic core can therefore also theoretically extend as far as the limit of the recess 7a and/or 7b due to the tolerance.

In the present example, the minimum value for the solid insulation between two conductors belonging to different circuits on the same inner layer is predetermined that x=0.4 mm. If other tolerances are also added with respect to the conductive pattern, e.g., of 0.1 mm and the recess, e.g., also 0.1 mm, then a minimum distance of xA=0.6 mm from the edges, e.g., the milling contours, of the recesses 7a and 7b is selected.

Consequently, there is a minimum distance of xA13=XA=0.6 mm is given between the conductors 3a, 3b and the edge of the recess 7b (cf. FIGS. 6, 7). Likewise, according to an expedient embodiment of the vias, it must be pointed out that the minimum distance of x=0.4 mm is also maintained between the conductors 3a, 3b and the via 6-1, which is associated with the circuit 1. The tolerance of milling or a recess edge does not usually play any role here, but a tolerance of the conductive pattern, e.g., of 0.1 mm is expediently taken into account and consequently, a safety margin of x13=0.5 mm between the respective winding 3a and/or 3b and the via 6-1 is expediently maintained (cf. FIGS. 6, 7).

Due to the layer structure and an insulation layer between layers L1 and L3 having a minimum thickness y13 of 0.2 mm, for example, it is also ensured that the conductor 3a will not approach too closely to the conductor 1a of the coil 1a. The conductor 3b on the layer L4 is desired like the layer L3, but with the difference that it is designed to use two windings instead of eleven windings. Furthermore, the insulation layer here is expediently provided between the layers L2 and L4 with a minimum thickness of y24=y13, so that it is ensured that the conductor 3b on layer L4 does not approach too closely to the conductor 1b on the layer L2.

The asymmetry (eleven or two windings) of the circuit 3 also facilitates the formation of circuits 2 and 4, in which the conductors 2a and 4a respectively can be arranged one above the other so that they are wound around the outer leg 5s1 and consequently, also around the recess 7a. Only two inner layers L3 and L4 are available here for the windings of two galvanically isolated circuits, in particular two galvanically isolated circuits having intrinsic safety, so only one layer is advantageously used for the windings of each circuit. The conductor 4a for forming the 13 windings of the circuit 4 is thus formed completely on the layer L4, in particular in a spiral shape, so that all thirteen windings are positioned side by side on the layer L4 (cf. FIG. 7). Meanwhile, only a limited amount of space is available between the two recesses 7a and 7b, so the windings of the conductor 4a approach the recess 7b relatively closely to. For this reason as well, there is thus only a small amount of space has been reserved for a small number of windings for the circuit 3 on the layer L4, namely in the example shown here, for the two windings of the circuit 3 formed with the conductor 3b. Again, in an expedient embodiment, the safety margin of, for example, x34=0.5 mm (minimum distance plus a tolerance of the conductive pattern) is again maintained between the conductors 3b and 4a. The layer structure again ensures that the insulation with the thickness y34 between the layer L3 and L4 is sufficient to galvanically isolate the individual circuits 2 and 4 as well as 3 and 4 from one another, in particular also so that they are intrinsically safe. The insulation thickness y34 thus expediently corresponds to the insulation thickness y13 and y24.

The via 6-4 belonging to the circuit 4 is in turn so far away from the magnetic core 5, in particular from the edge of the recess 7a and from the conductors 1a and 1b of the circuit 1 in the x direction (i.e., in x1 and x2 directions) that the air and creep zones of LS14 are maintained. The circuit 4 can be contacted with the respective circuit on one of the layers L1, L2 or L3 at the via 6-4, so that the via 6-4 provides the connection G.

Furthermore, there is expediently again a minimum distance of xA14=xA=0.6 mm between the conductor 4a and the edge of the recess 7a, and again a safety margin of x24=0.5 mm, for example, is maintained between the conductor 4a and the via 6-2 (cf. FIG. 7).

The dimensioning of the conductor 2a on the layer L3 for the windings of the circuit 2 is preferably like that of the conductor 4a for the windings of the circuit 4. The via 6-2 is thus again far enough away from the hole 7a that the air and creep zones LS12=5.2 mm are maintained and the distance does not fall below that of preferably x24=0.5 mm on the inner layer L4 between the via 6-2 and the conductors 4a of the windings of the circuit 4. Furthermore, a minimum distance of xA12=xA=0.6 mm is expediently again maintained between the conductor 2a and the edge of the recess 7a, and the safety margin of x23=0.5 mm (minimum distance plus the tolerance of the conductive pattern), for example, is again maintained between the conductors 2a and 3a in an expedient embodiment.

Thus, all the circuits 1 through 4 are galvanically isolated from one another according to the insulation requirements, in particular also being isolated from one another in an intrinsically safe manner, and the planar transformer is completed according to the invention. It should be pointed out that there may also be mixed forms within the scope of the invention, such that some of the circuits may be galvanically isolated from one another and some of them may be isolated from one another in an intrinsically safe manner.

Five galvanically isolated circuits, in particular also including galvanically isolated circuits that are intrinsically safe, are thus theoretically possible within the scope of the invention when using four layers of a circuit board to form electrical conductors, a protective coating, in particular a solder stop coating, on a conductor situated on an outer layer and on normal vias, i.e., vias with completely lined electrical material passing through the entire circuit board. To form the respective windings of a first circuit, either one conductor is arranged on an outer layer or two conductors are arranged on the two outer layers.

Furthermore, in particular also from the standpoint of optimum utilization of copper, the design of conductors formed on outer layers can be further improved in comparison with FIGS. 5 and 8. If only windings are placed only around the recess 7b in FIGS. 5 and 8, then FIG. 9 shows a modified or alternative specific embodiment, in which additional windings 1c, 1d of the first circuit 1 are also passed around the other recess 7a. These windings must then be adapted by the coil direction and/or also the winding direction, so that the magnetic fluxes in the core are superimposed in the same direction. In the specific exemplary embodiment according to FIG. 9, this means that the windings formed by the conductors 1a and 1b and the windings formed by the conductors 1c and 1d are connected in an anti-serial connection, i.e., the winding formed by the conductor 1a and the winding formed by the conductor 1c are electrically connected, the arrangement being diagramed by the dashed line between the connections labeled as A' and B'. However, the basic properties are not affected by this measure, although in this case it may optionally be necessary to adapt and/or displace the conductors onto the inner layers and the vias 6-2 and 6-4 (cf. FIGS. 5 and 8) because LS12 and LS14 are different and at least one new via 6-1a is to be added (cf. FIG. 9). Consequently, according to one embodiment in FIG. 9, for example, conductors and thus also windings are wound around both outer legs for at least one of the circuits, i.e., in the case illustrated here, for the circuit 1. Furthermore, in an expedient addition for this circuit, conductors and thus also windings are formed on two different layers, i.e., on layers L1 and L2 in the case illustrated here. For a second circuit, a conductor is arranged around a first outer leg, for example, around the outer leg inserted into the recess 7a, to form the respective windings on the first inner layer. For a third circuit, a conductor is arranged around the second leg of the magnetic core, for example, around the outer leg that has been inserted into the recess 7b, to form the respective windings on the same inner layer. For a fourth circuit, a conductor is arranged with windings around the first outer leg to form the respective windings on a second inner layer, and for a fifth circuit, a conductor is arranged with windings around the second outer leg of the magnetic core to form the respective windings on the same second inner layer.

Figure 10:
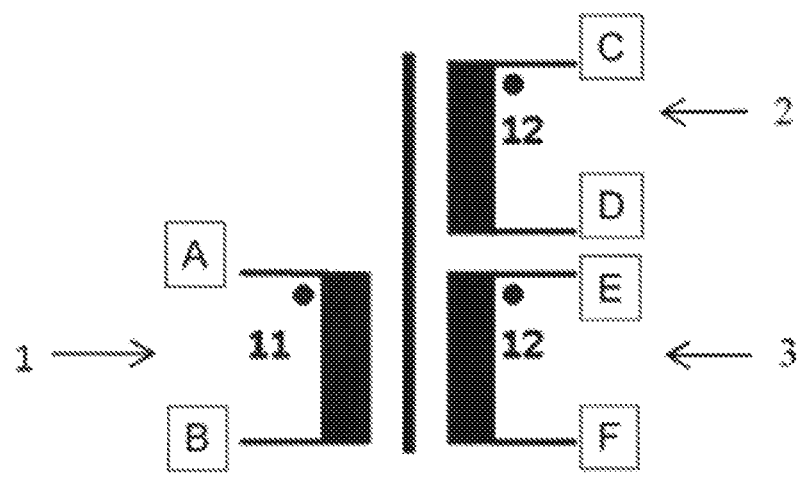
FIG. 10 shows an equivalent circuit diagram of a transformer comprising three circuits.

If, in modification of the equivalent circuit diagram according to FIG. 1, for example, the circuit 4 can be omitted and thus only three circuits can be implemented with a winding ratio of 11:12:12, for example, according to FIG. 10, starting from a primary winding (circuit 1) up to two secondary windings (circuits 2 and 3), then within the scope of the invention, three layers of a circuit board may already be enough to form electrical conductors. Based on the equivalent circuit diagram according to FIG. 10, for example, a conductor may be formed on at least one of the outer layers for a first circuit of the at least three circuits 1, 2, 3. The windings thereby formed may be wound around a first outer leg and/or around the second outer leg of the magnetic core.

For the remaining two circuits, a conductor may thus be formed on what is then the single inner layer and then the conductor of the one circuit of the remaining two circuits is wound around a first outer leg, and the conductor of the other circuit of the remaining two circuits is wound around the second outer leg. Based on the number of windings indicated in FIG. 10, a planar transformer based on this design and having only three layers but a somewhat greater horizontal extent because either twelve windings of the circuits 2 and 3 are arranged on the inner layer or eleven windings of the circuit 1 and twelve windings of circuit 2 or 3 are arranged on the inner layer. The windings of the remaining circuit are then arranged on one outer layer or on both outer layers.

The additional general properties of such a planar transformer are identical to those described previously.

Figure 11:
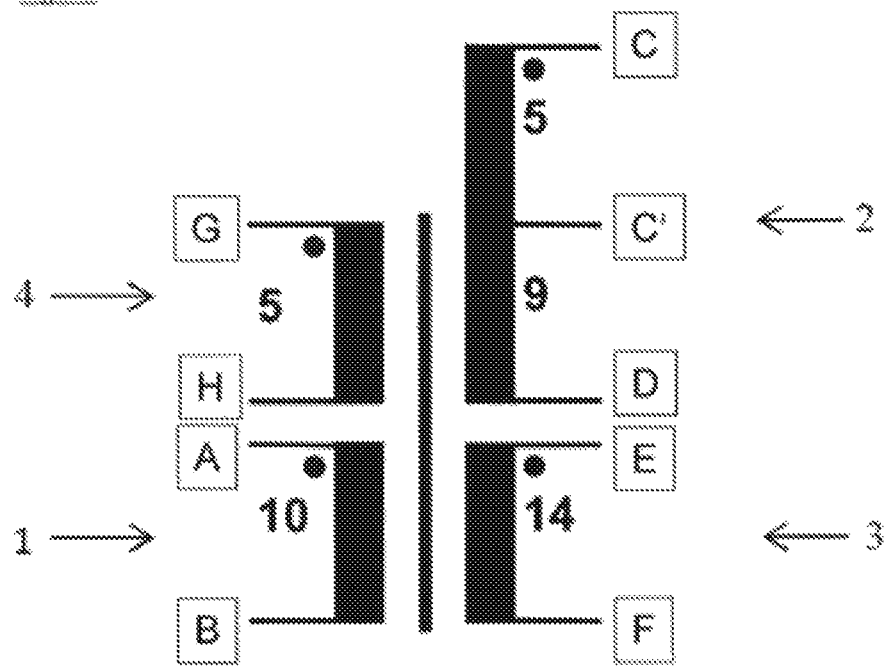
FIG. 11 shows an equivalent circuit diagram of a transformer having four circuits with a center tap.

Another preferred specific embodiment according to the invention will now be described on the basis of FIGS. 11 through 14 and is based on the equivalent circuit diagram according to FIG. 11, for example. Based on the equivalent circuit diagram according to FIG. 11, a planar transformer should be implemented with four circuits 1, 2, 3 and 4, wherein one of the circuits 1, 4 and 3 is the primary circuit, for example, and the remaining circuits are in turn equally entitled secondary circuits.

Even with one planar transformer according to the invention implementing this equivalent circuit diagram, the general properties are identical to those described above so that again only the differences will be discussed here.

One special feature is, for example, the fact that there are different insulation standards. For reasons of simplicity, the insulation standard for circuits 1, 2 and 3 correspond to those for the planar transformer according to FIGS. 1 through 8 but the circuit 4 should be designed with the connections G and H for a safe isolation of more than 300 V from 1000 V, for example. In this specific context, the result is that the air and creep zones of LS14, LS24 and LS34 are increased to 11.2 mm, for example, whereas a distance of 5.2 mm, for example, is again to be maintained for all other air and creep zones. Furthermore, the horizontal and vertical requirements of the solid insulation have also increased with respect to circuit 4, whereas with respect to all other circuits the horizontal and vertical requirements of the solid insulation again correspond to the specific embodiment according to FIGS. 1 through 8.

Another difference is, for example, the fact that according to the diagram, a central tap and/or a central connection C' should also be provided for the circuit 2.

Figure 12:
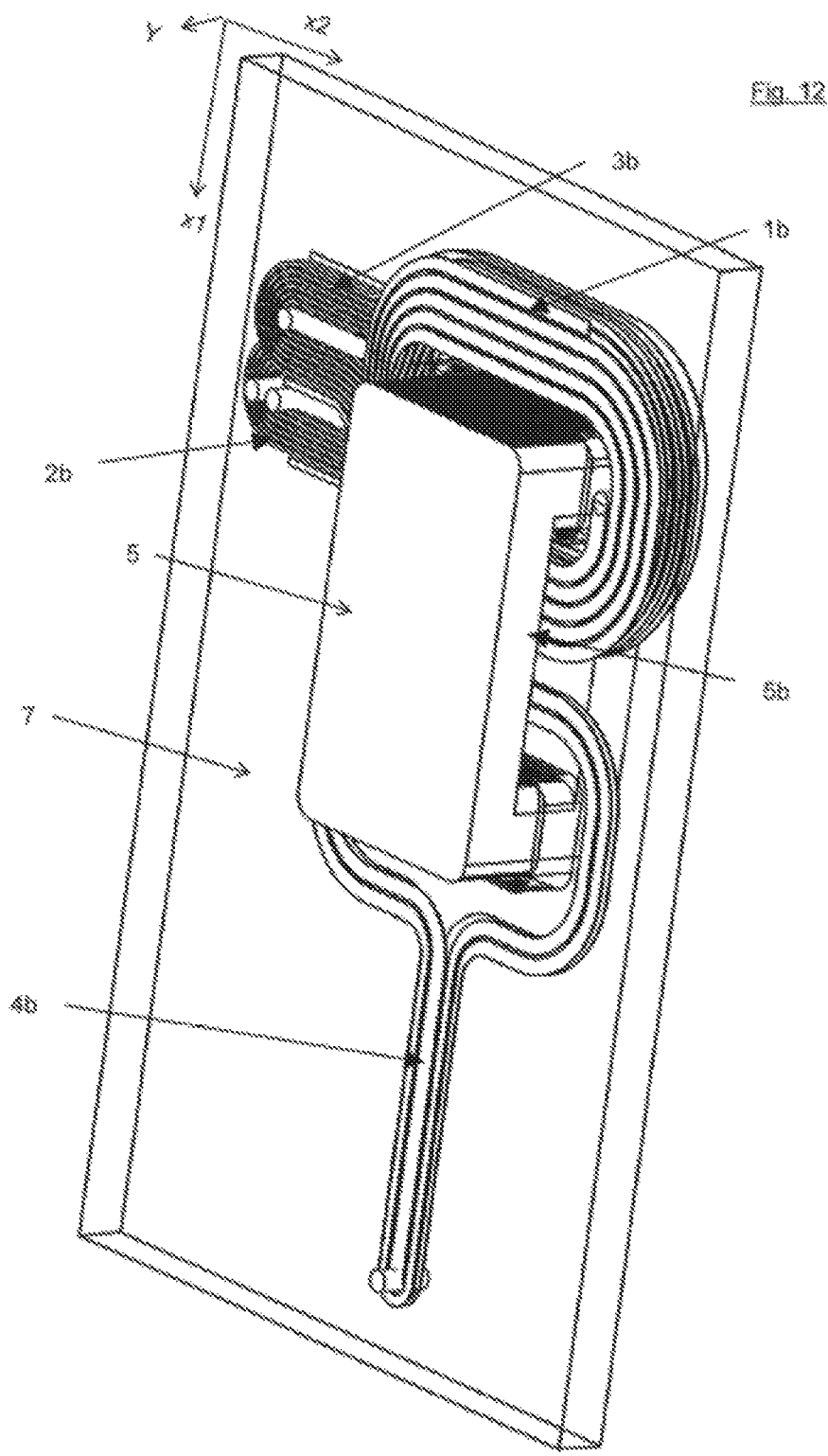
FIG. 12 shows a first schematic view of a planar transformer according to the invention for implementation of the equivalent circuit diagram according to FIG. 11 and with the circuit board still kept transparent for the sake of the illustration.
Figure 13:
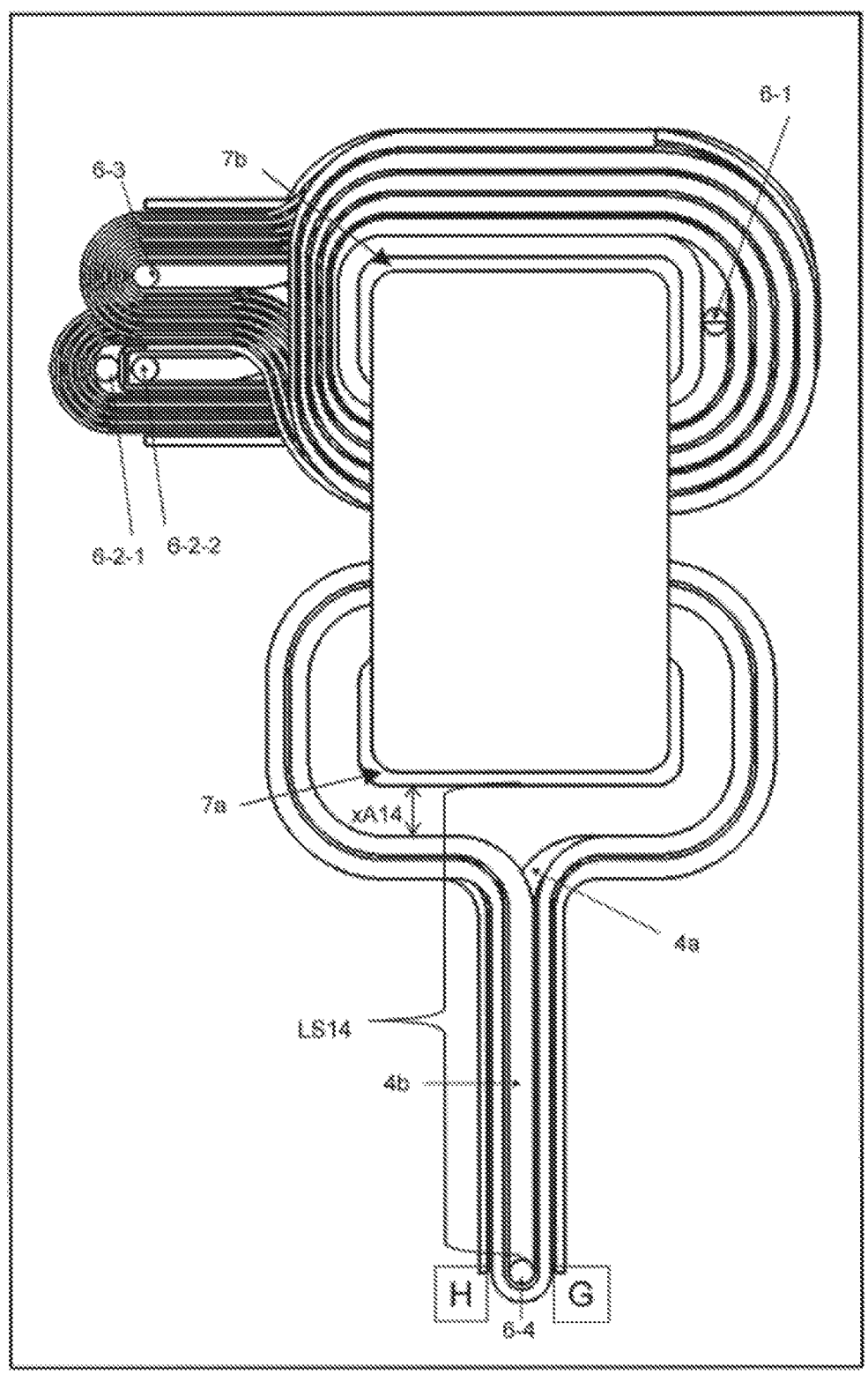
FIG. 13 shows another schematic view of the planar transformer according to FIG. 12 with the circuit board kept transparent.
Figure 14:
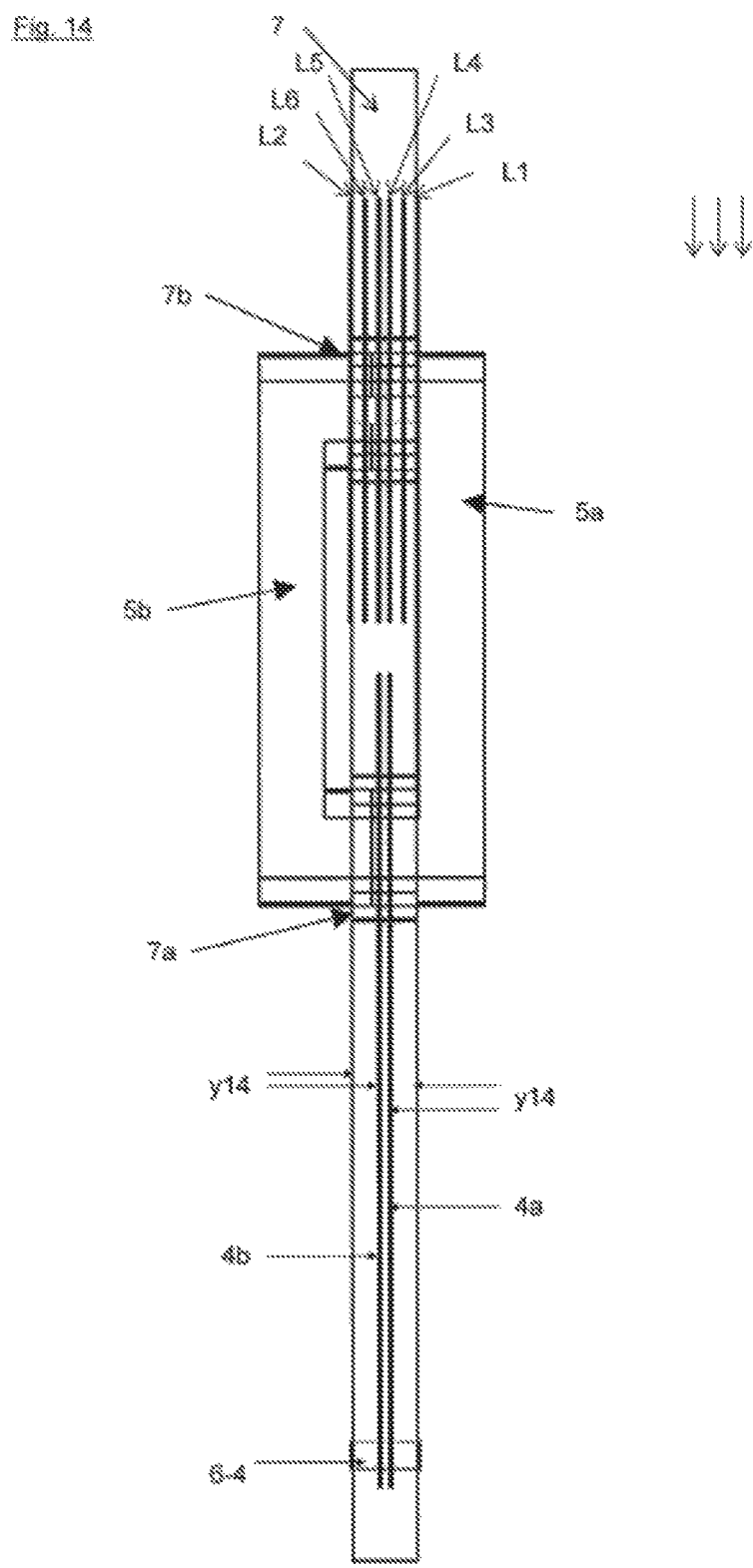
FIG. 14 shows a schematic sectional view through the planar transformer according to FIG. 12.
Figure 15:
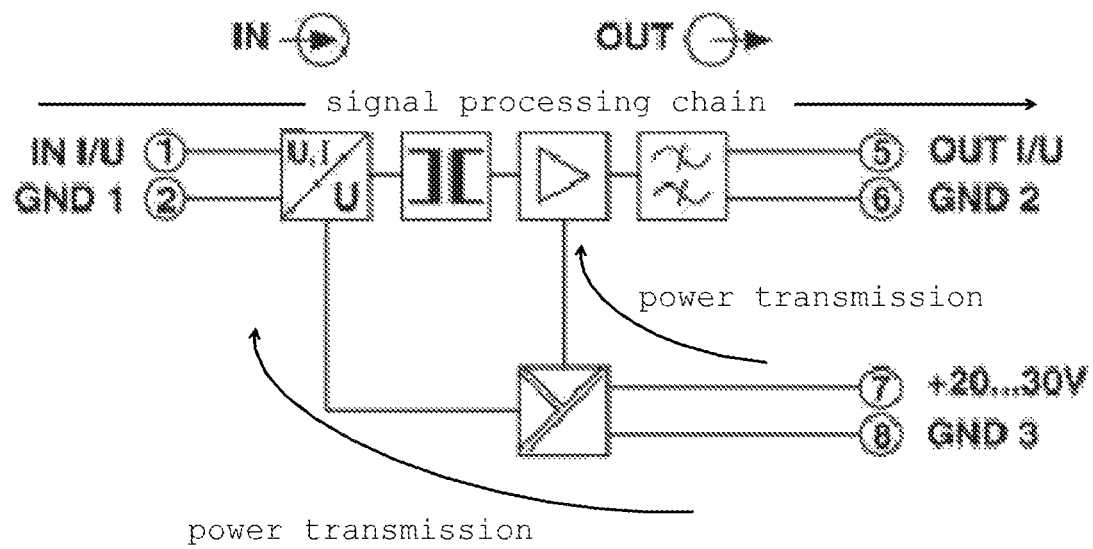
FIG. 15 shows a greatly simplified diagram relating to the use of a transformer within an isolation amplifier for galvanic isolation of analog signals.

To nevertheless achieve a flat design with a planar transformer according to invention with continued good dissipation of heat that is to be implemented according to FIGS. 12 through 14, so that the transformer can be integrated into devices of a low installation height, for example, preferably only the windings of the circuit 4 are wound around one leg, and the windings of all other circuits are wound around the other leg with none of the windings of these additional circuits being arranged directly above or below the windings of circuit 4. The entire design height can still be minimized in this way, despite the increased vertical demand with respect to circuit 4 and the evolution of heat in the entire horizontal and vertical areas of circuit 4, which is substantiated only by these requirements. Furthermore, for a further improvement in the dissipation of heat, the circuit 4 is expediently distributed among inner layers, so that the windings of an additional circuit are arranged on one or more outer layers, so that these windings can make a further contribution toward improved dissipation of heat by direct dissipation of heat to the surrounding air.

The sandwich-type circuit board 7 having six layers L1 to L6 to form electrical conductors is selected on this basis (cf. FIGS. 12 through 14). The circuit board is thus somewhat thicker on the whole than is the case with the specific embodiment according to FIGS. 1 through 8. The windings of the circuit 4 are expediently formed on the two innermost layers L4 and L5, and none of the windings of the other circuits is arranged directly above or below the windings of circuit 4. For example, a first circuit 4a may be arranged around the recess 7a on layer L4 to form five windings of circuit 4 on layer L4, and a second conductor 4b may also be arranged around the recess 7a to form five windings of the circuit 4 on layer L5 (cf. FIG. 14).

With the increased vertical demand with respect to the circuit 4, then a greater distance of y14 in each case is to be maintained only between the layers L1 and L4 as well as between the layers L5 and L2. Since the vertical demand with respect to the other circuits corresponds to that according to the embodiment illustrated in FIGS. 1 through 8, only a distance of 0.2 mm, for example, is to be maintained between each of the other layers. The thickness of the entire circuit board 7 is thus determined by two multiplied by the increased distance y14 and one multiplied by the smaller distance of 0.2 mm, for example, or by five times the smaller distance of 0.2 mm, for example, if 0.4 mm is sufficient for y14, for example.

Since the air and creep zones of LS14, LS24 and LS34 have also increased in size with respect to circuit 4, this justifies the great distance from the hole 7a of the via 6-4 connecting the conductors 4a and 4b electrically to one another. For example, if the windings of the circuits 1 are arranged on at least one of the outer layers, then this great distance corresponds to the via 6-4 connecting the conductors 4a and 4b electrically to one another from the hole 7a of the air and creep zones LS14. Since the horizontal demands of the solid insulation have also increased with respect to the circuit 4, the distance of the conductors 4a and 4b of circuit 4 from the edge of the recess 7a is also greater than it was previously. If the windings of the circuits 1 are arranged on at least one of the outer layers, then this distance of conductors 4a and 4b of the circuit 4 from the edge of the recess 7a can be characterized as xA14 according to the discussion of the embodiment according to FIGS. 1 through 8 (cf. FIG. 13).

However, when using six layers, the windings of circuits 1, 2 and 3 can each be distributed to two layers, which in turn reduces the requirement horizontal extent. For example, if the conductors of circuit 1 are distributed on the two outer layers L1 and L2, then the conductors of circuit 2 can be distributed to the two layers L3 and L4, for example, and the conductors of circuit 3 can be distributed to the two layers L5 and L6, for example, in particular with the most even possible distribution in terms of the numbers. The inner end of each winding of circuits 1 and 3 is then in turn expediently connected electrically to a via 6-1 and/or 6-3, to which a connection which is not shown explicitly for reasons of simplicity but is also guided outward on another layer, is applied. With respect to the circuit 2, two vias 6-2-1 and 6-2-2 are electrically connected to the windings because of the required center tap C', so that not only is one connection (which is not shown here explicitly for reasons of simplicity) guided outward but also the center tap C' can be made available to the outside on another layer. Consequently, the total area of the conductors, in particular the copper conductors, and thus the amount of material to absorb and dissipate heat can be greater with otherwise the same dimensions of the planar transformer on the whole and can be designed with larger dimensions than is the case in the prior art.

With this technology, which is used with preferred specific embodiments, i.e., with a sandwich-type circuit board 7 having six layers L1 to L6 to form electrical conductors, protective coating and normal vias, nine galvanically isolated circuits in particular including those with intrinsic safety can theoretically be implemented.

To form the respective windings of a first circuit, either one conductor is arranged on an outer layer or two conductors are arranged on both outer layers. To form windings belonging to four additional circuits, the four inner layers may be placed around a first outer leg of the magnetic core and to form windings belonging to additional circuits, namely up to four additional circuits, the same four inner layers may be used around the second outer leg of the magnetic core.

Consequently, [(N−2)*2]+1 galvanically isolated circuits, in particular intrinsically safe isolated circuits can be implemented by using a sandwich-type circuit board 7 having a plurality of N layers to form electrical conductors, plus protective coating and normal vias.

In practice, however, multiple inner layers are preferably combined to permit lower copper losses.

In a preferred embodiment, a planar transformer according to the invention can thus be integrated into an isolation amplifier, in particular the housing of an isolation amplifier, although this is not illustrated further in the figures for reasons of simplicity.

LIST OF REFERENCE NUMERALS

1, 2, 3, 4 circuit and/or potential group and/or winding of the transformer;
1a, 1b, 2a, 2b, 3a, 3b, 4a, 4b conductors; A, A', B, B', C, C', D, E, F, G, H connections for electrical contacting;
5 magnetic core;
5a first part of the magnetic core;
5b second part of the magnetic core;
5m central part of the first part of the magnetic core;
5s1, 5s2 outer leg of the first part of the magnetic core;
6-1, 6-1a, 6-1, 6-2-1, 6-2-3, 6-3, 6-4a vias;
7 circuit board;
7a, 7b recesses in the circuit board;
L1, L2, L3, L4, L5, L6 layers to form conductors;
LS air and creep zones;
x, y insulation distances within the insulation material between two different circuits;
xA insulation distances within the insulation material between one circuit and the edge of a recess;
100 planar transformer according to the invention.

The invention claimed is:

1. A planar transformer for power transmission, having a vertical extent and a horizontal extent, comprising:
a circuit board having a sandwich-type structure with at least three layers having electrical conductors disposed thereon, wherein a first layer and a second layer of the layers form first and second exterior layers of the circuit board, and each additional one of the layers forms an inner layer of the circuit board, and wherein an insulation material with a minimum thickness is arranged between all of the layers,
a number of at least three mutually galvanically isolated circuits wherein only one of the circuits forms a primary circuit of the planar transformer and the other ones of the circuits forms a first secondary circuits the planar transformer, and wherein electric current is fed in through the primary circuit for power transmission and an output current is topped from the secondary circuits,
a magnetic core, which at least partially encloses the circuit board and acts on the primary circuit and on at least two of the secondary circuits,
wherein the magnetic core is comprised of two interconnected magnetic core parts, wherein a first one of the core parts forms a U shape having only first and second outer legs, the first outer leg disposed at a first end of the first one of the core parts, the second outer leg disposed at a second end of the first one of the core parts, and a central part extending from the first outer leg to the second outer leg, and wherein the circuit board has only two recesses, and the first and second outer legs of the first one of the core parts are inserted into these recesses and connected to the second one of the core parts at their free ends remote from the central part,
wherein a first one of the electrical conductors is disposed on an exterior surface of the first exterior layer of the circuit board and a second one of the electrical conductors is disposed on an exterior surface of the second exterior layer of the circuit board, wherein only the first and second ones of the electrical conductors form only a first one of the at least three mutually galvanically isolated circuits,
wherein each of the at least two other of the at least three mutually galvanically isolated circuits includes at least another one of the electrical conductors, wherein the electrical conductors of the at least two other of the at least three mutually galvanically isolated circuits are disposed on the inner layers of the circuit board, wherein the first electrical conductor disposed on the exterior surface of the first exterior layer and the second electrical conductor disposed on the second exterior surface of the circuit board are wound around only one of the first and second outer legs, and the at least another one of the electrical conductors of a second one of the at least two other of the at least three mutually galvanically isolated circuits is wound around the second outer leg, and the at least another one of the electrical conductors of a third one of the at least two other of the at least three mutually galvanically isolated circuits is wound around the first outer leg, and wherein the first and second electrical conductors formed on the exterior surfaces the first and second exterior layers is are each covered by a protective coating.

2. The planar transformer according to claim 1, wherein the planar transformer is integrated into a housing of an isolation amplifier.

3. The planar transformer according to claim 1, wherein the core is to be associated with a potential of one of the first and second electrical conductors formed on the corresponding one of the first and second exterior layers with respect to the galvanic isolation of the circuits.

4. The planar transformer according to claim 1, wherein for each of the electrical conductors formed on one of the layers of the circuit board, at least one end is electrically connected to a via, wherein the via is electrically connected to a connection arranged in another one of the layers for electrical contacting of the conductor.

5. The planar transformer according to claim 4, wherein the via is passed completely through all the layers of the circuit board and is lined with electrically conductive material.

6. The planar transformer according to claim 4, wherein a predetermined minimum distance between an air and creep zone and two of the circuits defines the minimum distance between the via of one of the circuits and the edges of the two recesses.

7. The planar transformer according to claim 4, wherein a via belonging to a conductor wound around one of the outer legs is always arranged in the interior of the conductor wound around that one of the outer legs.

8. A planar transformer for power transmission, having a vertical extent and a horizontal extent, comprising:

a circuit board having a sandwich-type structure with at least three layers having electrical conductors disposed thereon, wherein a first layer and a second layer of the layers form first and second exterior layers of the circuit board, and each additional one of the layers forms an inner layer of the circuit board, and wherein an insulation material with a minimum thickness is arranged between all of the layers, a number of at least three mutually galvanically isolated circuits wherein only one of the circuits forms a primary circuit of the planar transformer and the other ones of the circuits forms secondary circuits the planar transformer, and wherein electric current is fed in through the primary circuit for power transmission and an output current is topped from the secondary circuits, a magnetic core, which at least partially encloses the circuit board and acts on the primary circuit and on at least two of the secondary circuits, wherein the magnetic core is comprised of two interconnected magnetic core parts, wherein a first one of the core parts forms a U shape with a central part and first and second outer legs, and wherein the circuit board has two recesses, and the first and second outer legs of the first one of the core parts are inserted into these recesses and connected to the second one of the core parts at their ends remote from the central part, wherein a first one of the electrical conductors is disposed on an exterior surface of the first exterior layer of the circuit board and a second one of the electrical conductors is disposed on an exterior surface of the second exterior layer of the circuit board, wherein only the first and second ones of the electrical conductors form only a first one of the at least three mutually galvanically isolated circuits, wherein each of the at least two other of the at least three mutually galvanically isolated circuits includes at least another one of the electrical conductors, wherein the electrical conductors of the at least two other of the at least three mutually galvanically isolated circuits are disposed on the inner layers or a same one of the inner layers of the circuit board, wherein the first electrical conductor disposed on the exterior surface of the first exterior layer and the second electrical conductor disposed on the second exterior surface of the circuit board are wound around only the first outer leg, and the at least another one of the electrical conductors of a second one of the at least two other of the at least three mutually galvanically isolated circuits is wound around one of the first and second outer legs, and wherein the first and second electrical conductors formed on the exterior surfaces the first and second exterior layers are each covered by a protective coating.

9. The planar transformer according to claim 8, wherein the electrical conductors of the at least two other of the at least three mutually galvanically isolated circuits are formed on the same one of the inner layers of the circuit board.

* * * * *